(12) United States Patent
He et al.

(10) Patent No.: US 12,165,687 B2
(45) Date of Patent: Dec. 10, 2024

(54) APPARATUSES AND METHODS FOR ROW HAMMER COUNTER MAT

(71) Applicant: MICRON TECHNOLOGY, INC., Boise, ID (US)

(72) Inventors: Yuan He, Boise, ID (US); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 140 days.

(21) Appl. No.: 17/565,119

(22) Filed: Dec. 29, 2021

(65) Prior Publication Data

US 2023/0206980 A1    Jun. 29, 2023

(51) Int. Cl.
| | |
|---|---|
| G11C 11/40 | (2006.01) |
| G11C 11/406 | (2006.01) |
| G11C 11/408 | (2006.01) |
| G11C 11/4091 | (2006.01) |
| G11C 11/4097 | (2006.01) |
| G11C 11/4099 | (2006.01) |

(52) U.S. Cl.
CPC ..... *G11C 11/40611* (2013.01); *G11C 11/4085* (2013.01); *G11C 11/4087* (2013.01); *G11C 11/4091* (2013.01); *G11C 11/4097* (2013.01); *G11C 11/4099* (2013.01)

(58) Field of Classification Search
CPC .......... G11C 11/40611; G11C 11/4085; G11C 11/4087; G11C 11/4097; G11C 11/4099; G11C 11/4091; G11C 11/40603; G11C 11/40618; G11C 11/40615
See application file for complete search history.

(56) References Cited

U.S. PATENT DOCUMENTS

| | | |
|---|---|---|
| 3,633,175 A | 1/1972 | Harper |
| 4,679,173 A | 7/1987 | Sato |
| 5,089,957 A | 2/1992 | Stultz et al. |
| (Continued) | | |

FOREIGN PATENT DOCUMENTS

| | | |
|---|---|---|
| CN | 1144434 A | 3/1997 |
| CN | 1195173 A | 10/1998 |
| (Continued) | | |

OTHER PUBLICATIONS

US 11,264,075 B2, 03/2022, Bell et al. (withdrawn)

(Continued)

*Primary Examiner* — Uyen Smet
(74) *Attorney, Agent, or Firm* — Dorsey & Whitney LLP

(57) ABSTRACT

Apparatuses and methods for row hammer counter mat. A memory array may have a number of memory mats and a counter memory mat. The counter mat stores count values, each of which is associated with a row in one of the other memory mats. When a row is accessed, the count value is read out, changed, and written back to the counter mat. In some embodiments, the count value may be processed within access logic of the counter mat, and a row hammer flag may be provided to the bank logic. In some embodiments, the counter mat may have a folded architecture where each sense amplifier is coupled to multiple bit lines in the counter mat. The count value may be used to determine if the accessed row is an aggressor so that its victims can be refreshed as part of a targeted refresh.

15 Claims, 15 Drawing Sheets

(56) References Cited

U.S. PATENT DOCUMENTS

| | | |
|---|---|---|
| 5,291,198 A | 3/1994 | Dingwall et al. |
| 5,299,159 A | 3/1994 | Balistreri et al. |
| 5,422,850 A | 6/1995 | Sukegawa et al. |
| 5,638,317 A | 6/1997 | Tran |
| 5,699,297 A | 12/1997 | Yamazaki et al. |
| 5,751,655 A | 5/1998 | Yamazaki et al. |
| 5,768,196 A | 6/1998 | Bloker et al. |
| 5,874,907 A | 2/1999 | Craft |
| 5,933,377 A | 8/1999 | Hidaka |
| 5,943,283 A | 8/1999 | Wong et al. |
| 5,970,507 A | 10/1999 | Kato et al. |
| 5,999,471 A | 12/1999 | Choi |
| 6,002,629 A | 12/1999 | Kim et al. |
| 6,011,734 A | 1/2000 | Pappert |
| 6,061,290 A | 5/2000 | Shirley |
| 6,212,118 B1 | 4/2001 | Fujita |
| 6,310,806 B1 | 10/2001 | Higashi et al. |
| 6,317,381 B1 | 11/2001 | Gans et al. |
| 6,373,738 B1 | 4/2002 | Towler et al. |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,480,931 B1 | 11/2002 | Buti et al. |
| 6,515,928 B2 | 2/2003 | Sato et al. |
| 6,567,340 B1 | 5/2003 | Nataraj et al. |
| 6,950,364 B2 | 9/2005 | Kim |
| 7,027,343 B2 | 4/2006 | Sinha et al. |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,283,380 B1 | 10/2007 | Srinivasan et al. |
| 7,304,875 B1 | 12/2007 | Lien et al. |
| 7,319,602 B1 | 1/2008 | Srinivasan et al. |
| 7,444,577 B2 | 10/2008 | Best et al. |
| 7,551,502 B2 | 6/2009 | Dono et al. |
| 7,565,479 B2 | 7/2009 | Best et al. |
| 7,830,742 B2 | 11/2010 | Han |
| 7,870,362 B2 | 1/2011 | Hong et al. |
| 7,872,907 B2 | 1/2011 | Okayama et al. |
| 8,174,921 B2 | 5/2012 | Kim et al. |
| 8,400,805 B2 | 3/2013 | Yoko |
| 8,451,677 B2 | 5/2013 | Okahiro et al. |
| 8,625,360 B2 | 1/2014 | Iwamoto et al. |
| 8,676,725 B1 | 3/2014 | Lin et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,058,900 B2 | 6/2015 | Kang |
| 9,087,554 B1 | 7/2015 | Park |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,251,885 B2 | 2/2016 | Greenfield et al. |
| 9,286,964 B2 | 3/2016 | Halbert et al. |
| 9,299,457 B2 | 3/2016 | Chun et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,412,432 B2 | 8/2016 | Narui et al. |
| 9,424,907 B2 | 8/2016 | Fujishiro |
| 9,449,675 B2 | 9/2016 | Wheeler |
| 9,484,079 B2 | 11/2016 | Lee |
| 9,514,850 B2 | 12/2016 | Kim |
| 9,570,143 B2 | 2/2017 | Lim et al. |
| 9,646,672 B1 | 5/2017 | Kim et al. |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Tavva |
| 9,741,409 B2 | 8/2017 | Jones et al. |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wel |
| 9,805,782 B1 | 10/2017 | Liou |
| 9,805,783 B2 | 10/2017 | Ito et al. |
| 9,818,469 B1 | 11/2017 | Kim et al. |
| 9,847,118 B1 | 12/2017 | Won |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 10,032,501 B2 | 7/2018 | Ito et al. |
| 10,083,737 B2 | 9/2018 | Bains et al. |
| 10,090,038 B2 | 10/2018 | Shin |
| 10,134,461 B2 | 11/2018 | Bell et al. |
| 10,147,472 B2 | 12/2018 | Jones et al. |
| 10,153,031 B2 | 12/2018 | Akamatsu |
| 10,170,174 B1 | 1/2019 | Ito et al. |
| 10,176,860 B1 | 1/2019 | Mylavarapu |
| 10,210,925 B2 | 2/2019 | Bains et al. |
| 10,297,305 B1 | 5/2019 | Moon et al. |
| 10,339,994 B2 | 7/2019 | Ito et al. |
| 10,381,327 B2 | 8/2019 | Ramachandra et al. |
| 10,387,276 B2 | 8/2019 | Ryu et al. |
| 10,446,216 B2 | 10/2019 | Oh et al. |
| 10,490,251 B2 | 11/2019 | Wolff |
| 10,600,462 B2 | 3/2020 | Augustine et al. |
| 10,600,491 B2 | 3/2020 | Chou et al. |
| 10,607,686 B2 | 3/2020 | Akamatsu |
| 10,629,286 B2 | 4/2020 | Lee et al. |
| 10,679,710 B2 | 6/2020 | Hirashima et al. |
| 10,705,900 B2 | 7/2020 | Jin |
| 10,770,127 B2 | 9/2020 | Shore et al. |
| 10,811,066 B2 | 10/2020 | Jones et al. |
| 10,832,792 B1 | 11/2020 | Penney et al. |
| 10,861,519 B2 | 12/2020 | Jones et al. |
| 10,867,660 B2 | 12/2020 | Akamatsu |
| 10,930,335 B2 | 2/2021 | Bell et al. |
| 10,943,636 B1 | 3/2021 | Wu et al. |
| 10,950,289 B2 | 3/2021 | Ito et al. |
| 10,964,378 B2 | 3/2021 | Ayyapureddi et al. |
| 11,011,215 B1 | 5/2021 | Parry et al. |
| 11,043,254 B2 | 6/2021 | Enomoto et al. |
| 11,139,015 B2 | 10/2021 | Brown et al. |
| 11,152,050 B2 | 10/2021 | Morohashi et al. |
| 11,158,364 B2 | 10/2021 | Penney et al. |
| 11,158,373 B2 | 10/2021 | Penney et al. |
| 11,200,942 B2 | 12/2021 | Jenkinson et al. |
| 11,222,682 B1 | 1/2022 | Enomoto et al. |
| 11,257,535 B2 | 2/2022 | Shore et al. |
| 11,264,096 B2 | 3/2022 | Schreck et al. |
| 11,322,192 B2 | 5/2022 | Morohashi et al. |
| 11,361,808 B2 | 6/2022 | Bell et al. |
| 11,386,946 B2 | 7/2022 | Ayyapureddi et al. |
| 11,398,265 B2 | 7/2022 | Wu et al. |
| 11,424,005 B2 | 8/2022 | Penney et al. |
| 11,462,291 B2 | 10/2022 | Pan |
| 11,482,275 B2 | 10/2022 | Ayyapureddi et al. |
| 11,521,669 B2 | 12/2022 | Enomoto et al. |
| 11,568,918 B2 | 1/2023 | Ayyapureddi et al. |
| 11,600,314 B2 | 3/2023 | Ayyapureddi et al. |
| 11,600,326 B2 | 3/2023 | Schreck et al. |
| 11,664,063 B2 | 5/2023 | Lovett |
| 11,688,451 B2 | 6/2023 | Zhang et al. |
| 11,694,738 B2 | 7/2023 | Morohashi et al. |
| 11,699,476 B2 | 7/2023 | Brown et al. |
| 11,854,618 B2 | 12/2023 | Penney |

(56) References Cited

U.S. PATENT DOCUMENTS

| | | |
|---|---|---|
| 11,984,148 B2 | 5/2024 | Penney et al. |
| 2001/0008498 A1 | 7/2001 | Ooishi |
| 2002/0007476 A1 | 1/2002 | Kishino |
| 2002/0078311 A1 | 6/2002 | Matsuzaki et al. |
| 2002/0080677 A1 | 6/2002 | Watanabe et al. |
| 2002/0181301 A1 | 12/2002 | Takahashi et al. |
| 2003/0063512 A1 | 4/2003 | Takahashi et al. |
| 2003/0067825 A1 | 4/2003 | Shimano et al. |
| 2003/0090400 A1 | 5/2003 | Barker |
| 2003/0095459 A1 | 5/2003 | Derner et al. |
| 2003/0123301 A1 | 7/2003 | Jang et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0052142 A1 | 3/2004 | Ikehashi et al. |
| 2004/0114446 A1 | 6/2004 | Takahashi et al. |
| 2004/0130959 A1 | 7/2004 | Kawaguchi |
| 2004/0174757 A1 | 9/2004 | Garverick et al. |
| 2004/0184323 A1 | 9/2004 | Mori et al. |
| 2004/0213035 A1 | 10/2004 | Cavaleri et al. |
| 2004/0218431 A1 | 11/2004 | Chung et al. |
| 2005/0041502 A1 | 2/2005 | Perner |
| 2005/0105315 A1 | 5/2005 | Shin et al. |
| 2005/0243629 A1 | 11/2005 | Lee |
| 2005/0265104 A1 | 12/2005 | Remaklus et al. |
| 2006/0039229 A1 | 2/2006 | Nakano |
| 2006/0059196 A1 | 3/2006 | Sato et al. |
| 2006/0083099 A1 | 4/2006 | Bae et al. |
| 2006/0087903 A1 | 4/2006 | Riho et al. |
| 2006/0119406 A1 | 6/2006 | Henzler et al. |
| 2006/0176744 A1 | 8/2006 | Stave |
| 2006/0262616 A1 | 11/2006 | Chen |
| 2007/0008799 A1 | 1/2007 | Dono et al. |
| 2007/0014174 A1 | 1/2007 | Ohsawa |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0133330 A1* | 6/2007 | Ohsawa ............... G11C 11/4091 365/222 |
| 2007/0153611 A1 | 7/2007 | Lee |
| 2007/0230264 A1 | 10/2007 | Eto |
| 2007/0237016 A1 | 10/2007 | Miyamoto et al. |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0062742 A1 | 3/2008 | Wang |
| 2008/0126893 A1 | 5/2008 | Harrand et al. |
| 2008/0130394 A1 | 6/2008 | Dono et al. |
| 2008/0181048 A1 | 7/2008 | Han |
| 2008/0224742 A1 | 9/2008 | Pomichter |
| 2008/0253212 A1 | 10/2008 | Iida et al. |
| 2008/0266990 A1 | 10/2008 | Loeffler |
| 2008/0288720 A1 | 11/2008 | Atwal et al. |
| 2008/0301362 A1 | 12/2008 | Cavanna et al. |
| 2008/0313494 A1 | 12/2008 | Hummler et al. |
| 2008/0316845 A1 | 12/2008 | Wang et al. |
| 2009/0021999 A1 | 1/2009 | Tanimura et al. |
| 2009/0059641 A1 | 3/2009 | Jeddeloh |
| 2009/0077571 A1 | 3/2009 | Gara et al. |
| 2009/0161457 A1 | 6/2009 | Wakimoto |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0213675 A1 | 8/2009 | Shino |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0054011 A1 | 3/2010 | Kim |
| 2010/0074042 A1 | 3/2010 | Fukuda et al. |
| 2010/0080074 A1 | 4/2010 | Ohmaru et al. |
| 2010/0110809 A1 | 5/2010 | Kobayashi et al. |
| 2010/0110810 A1 | 5/2010 | Kobayashi |
| 2010/0131812 A1 | 5/2010 | Mohammad |
| 2010/0157693 A1 | 6/2010 | Iwai et al. |
| 2010/0182863 A1 | 7/2010 | Fukiage |
| 2010/0260003 A1 | 10/2010 | Oh |
| 2010/0329069 A1 | 12/2010 | Ito et al. |
| 2011/0026290 A1 | 2/2011 | Noda et al. |
| 2011/0051530 A1 | 3/2011 | Kushida |
| 2011/0055495 A1 | 3/2011 | Remaklus, Jr. et al. |
| 2011/0069572 A1 | 3/2011 | Lee et al. |
| 2011/0122987 A1 | 5/2011 | Neyer |
| 2011/0216614 A1 | 9/2011 | Hosoe |
| 2011/0225355 A1 | 9/2011 | Kajigaya |
| 2011/0286271 A1 | 11/2011 | Chen |
| 2011/0310648 A1 | 12/2011 | Iwamoto et al. |
| 2011/0317462 A1 | 12/2011 | Gyllenhammer et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0213021 A1 | 8/2012 | Riho et al. |
| 2012/0254472 A1 | 10/2012 | Ware et al. |
| 2013/0003467 A1 | 1/2013 | Klein |
| 2013/0003477 A1 | 1/2013 | Park et al. |
| 2013/0057173 A1 | 3/2013 | Yao et al. |
| 2013/0107623 A1 | 5/2013 | Kavalipurapu et al. |
| 2013/0173971 A1 | 7/2013 | Zimmerman |
| 2013/0254475 A1 | 9/2013 | Perego et al. |
| 2013/0279284 A1 | 10/2013 | Jeong |
| 2013/0304982 A1 | 11/2013 | Jung et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0078845 A1 | 3/2014 | Song |
| 2014/0085995 A1 | 3/2014 | Greenfield et al. |
| 2014/0089576 A1 | 3/2014 | Bains et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0136763 A1 | 5/2014 | Li et al. |
| 2014/0143473 A1 | 5/2014 | Kim et al. |
| 2014/0177370 A1 | 6/2014 | Halbert et al. |
| 2014/0177376 A1 | 6/2014 | Song |
| 2014/0189215 A1 | 7/2014 | Kang et al. |
| 2014/0189228 A1 | 7/2014 | Greenfield et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0269021 A1 | 9/2014 | Yang et al. |
| 2014/0281206 A1 | 9/2014 | Crawford et al. |
| 2014/0281207 A1 | 9/2014 | Mandava et al. |
| 2014/0292375 A1 | 10/2014 | Angelini et al. |
| 2014/0293725 A1 | 10/2014 | Best et al. |
| 2014/0317344 A1 | 10/2014 | Kim |
| 2014/0355332 A1 | 12/2014 | Youn et al. |
| 2014/0369109 A1 | 12/2014 | Lee et al. |
| 2014/0379978 A1 | 12/2014 | Kim et al. |
| 2015/0049567 A1 | 2/2015 | Chi |
| 2015/0055420 A1 | 2/2015 | Bell et al. |
| 2015/0078112 A1 | 3/2015 | Huang |
| 2015/0089326 A1 | 3/2015 | Joo et al. |
| 2015/0155027 A1 | 6/2015 | Abe et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0213877 A1 | 7/2015 | Darel |
| 2015/0228341 A1 | 8/2015 | Watanabe et al. |
| 2015/0243339 A1 | 8/2015 | Bell et al. |
| 2015/0255140 A1 | 9/2015 | Song |
| 2015/0262652 A1 | 9/2015 | Igarashi |
| 2015/0279441 A1 | 10/2015 | Greenberg et al. |
| 2015/0279442 A1 | 10/2015 | Hwang |
| 2015/0294711 A1 | 10/2015 | Gaither et al. |
| 2015/0340077 A1 | 11/2015 | Akamatsu |

(56) References Cited

U.S. PATENT DOCUMENTS

| | | |
|---|---|---|
| 2015/0356048 A1 | 12/2015 | King |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narul et al. |
| 2016/0078845 A1 | 3/2016 | Lin et al. |
| 2016/0078911 A1 | 3/2016 | Fujiwara et al. |
| 2016/0078918 A1 | 3/2016 | Hyun et al. |
| 2016/0086649 A1 | 3/2016 | Hong et al. |
| 2016/0086651 A1 | 3/2016 | Kim |
| 2016/0093402 A1 | 3/2016 | Kitagawa et al. |
| 2016/0099043 A1 | 4/2016 | Tu |
| 2016/0111140 A1 | 4/2016 | Joo et al. |
| 2016/0125931 A1 | 5/2016 | Doo et al. |
| 2016/0133314 A1 | 5/2016 | Hwang et al. |
| 2016/0140243 A1 | 5/2016 | Adams et al. |
| 2016/0163372 A1 | 6/2016 | Lee et al. |
| 2016/0172056 A1 | 6/2016 | Huh |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0211008 A1 | 7/2016 | Benedict et al. |
| 2016/0224262 A1 | 8/2016 | Mandava et al. |
| 2016/0225433 A1 | 8/2016 | Bains et al. |
| 2016/0225461 A1 | 8/2016 | Tuers et al. |
| 2016/0246525 A1 | 8/2016 | Jeffrey et al. |
| 2016/0336060 A1 | 11/2016 | Shin |
| 2016/0343423 A1 | 11/2016 | Shido |
| 2017/0011792 A1 | 1/2017 | Oh et al. |
| 2017/0076779 A1 | 3/2017 | Bains et al. |
| 2017/0092350 A1 | 3/2017 | Halbert et al. |
| 2017/0117030 A1 | 4/2017 | Fisch et al. |
| 2017/0133085 A1 | 5/2017 | Kim et al. |
| 2017/0139641 A1 | 5/2017 | Cha et al. |
| 2017/0140807 A1 | 5/2017 | Sun et al. |
| 2017/0140811 A1 | 5/2017 | Joo |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0287547 A1 | 10/2017 | Ito et al. |
| 2017/0323675 A1 | 11/2017 | Jones et al. |
| 2017/0352399 A1 | 12/2017 | Yokoyama et al. |
| 2017/0371742 A1 | 12/2017 | Shim et al. |
| 2017/0372767 A1 | 12/2017 | Kang et al. |
| 2018/0004592 A1 | 1/2018 | Bains et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0060194 A1 | 3/2018 | Ryu et al. |
| 2018/0061483 A1 | 3/2018 | Morgan |
| 2018/0082737 A1 | 3/2018 | Lee |
| 2018/0084314 A1 | 3/2018 | Koyama |
| 2018/0090199 A1 | 3/2018 | Kim et al. |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0114561 A1 | 4/2018 | Fisch et al. |
| 2018/0114565 A1 | 4/2018 | Lee |
| 2018/0158504 A1 | 6/2018 | Akamatsu |
| 2018/0158507 A1 | 6/2018 | Bang |
| 2018/0182445 A1 | 6/2018 | Lee et al. |
| 2018/0203621 A1 | 7/2018 | Ahn et al. |
| 2018/0218767 A1 | 8/2018 | Wolff |
| 2018/0261268 A1 | 9/2018 | Hyun et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2018/0342282 A1 | 11/2018 | Morgan |
| 2018/0366182 A1 | 12/2018 | Hyun et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0066759 A1 | 2/2019 | Nale |
| 2019/0066762 A1 | 2/2019 | Koya |
| 2019/0088315 A1 | 3/2019 | Saenz et al. |
| 2019/0088316 A1 | 3/2019 | Inuzuka et al. |
| 2019/0096492 A1 | 3/2019 | Cai et al. |
| 2019/0103147 A1 | 4/2019 | Jones et al. |
| 2019/0130961 A1 | 5/2019 | Bell et al. |
| 2019/0139599 A1 | 5/2019 | Ito et al. |
| 2019/0147941 A1 | 5/2019 | Qin et al. |
| 2019/0147964 A1 | 5/2019 | Yun et al. |
| 2019/0161341 A1 | 5/2019 | Howe |
| 2019/0172518 A1 | 6/2019 | Chen et al. |
| 2019/0187745 A1 | 6/2019 | Murali et al. |
| 2019/0196730 A1 | 6/2019 | Imran |
| 2019/0198078 A1 | 6/2019 | Hoang et al. |
| 2019/0198090 A1 | 6/2019 | Lee |
| 2019/0198099 A1 | 6/2019 | Mirichigni et al. |
| 2019/0205253 A1 | 7/2019 | Roberts |
| 2019/0207736 A1 | 7/2019 | Ben-tovim et al. |
| 2019/0228810 A1 | 7/2019 | Jones et al. |
| 2019/0228813 A1 | 7/2019 | Nale et al. |
| 2019/0228815 A1 | 7/2019 | Morohashi et al. |
| 2019/0237131 A1 | 8/2019 | Ito |
| 2019/0237132 A1 | 8/2019 | Morohashi |
| 2019/0243708 A1 | 8/2019 | Cha et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0333573 A1 | 10/2019 | Shin et al. |
| 2019/0347019 A1 | 11/2019 | Shin et al. |
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0348107 A1 | 11/2019 | Shin et al. |
| 2019/0349545 A1 | 11/2019 | Koh et al. |
| 2019/0362774 A1 | 11/2019 | Kuramori et al. |
| 2019/0371391 A1 | 12/2019 | Cha et al. |
| 2019/0385661 A1 | 12/2019 | Koo et al. |
| 2019/0385667 A1 | 12/2019 | Morohashi et al. |
| 2019/0386557 A1 | 12/2019 | Wang et al. |
| 2020/0005857 A1 | 1/2020 | Ito et al. |
| 2020/0075106 A1 | 3/2020 | Tokutomi et al. |
| 2020/0082873 A1 | 3/2020 | Wolff |
| 2020/0090760 A1 | 3/2020 | Purahmad et al. |
| 2020/0135263 A1 | 4/2020 | Brown et al. |
| 2020/0194050 A1 | 6/2020 | Akamatsu |
| 2020/0194056 A1 | 6/2020 | Sakurai et al. |
| 2020/0201380 A1 | 6/2020 | Murali et al. |
| 2020/0202921 A1 | 6/2020 | Morohashi et al. |
| 2020/0211626 A1 | 7/2020 | Hiscock et al. |
| 2020/0211633 A1 | 7/2020 | Okuma |
| 2020/0211636 A1 | 7/2020 | Hiscock et al. |
| 2020/0251158 A1 | 8/2020 | Shore et al. |
| 2020/0294576 A1 | 9/2020 | Brown et al. |
| 2020/0302994 A1 | 9/2020 | Enomoto et al. |
| 2020/0321049 A1 | 10/2020 | Meier et al. |
| 2020/0349995 A1 | 11/2020 | Shore et al. |
| 2020/0365208 A1 | 11/2020 | Schreck et al. |
| 2020/0381040 A1 | 12/2020 | Penney et al. |
| 2020/0395072 A1 | 12/2020 | Penney et al. |
| 2020/0411095 A1 | 12/2020 | Kim |
| 2021/0005229 A1 | 1/2021 | Hiscock et al. |
| 2021/0005240 A1 | 1/2021 | Brown et al. |
| 2021/0020223 A1 | 1/2021 | Ayyapureddi et al. |
| 2021/0020262 A1 | 1/2021 | Penney et al. |
| 2021/0026732 A1 | 1/2021 | Park et al. |
| 2021/0057012 A1 | 2/2021 | Ayyapureddi et al. |
| 2021/0057013 A1 | 2/2021 | Jenkinson et al. |
| 2021/0057021 A1 | 2/2021 | Wu et al. |
| 2021/0065755 A1 | 3/2021 | Kim et al. |
| 2021/0065764 A1 | 3/2021 | Cheng et al. |
| 2021/0142852 A1 | 5/2021 | Schreck et al. |
| 2021/0158851 A1 | 5/2021 | Ayyapureddi et al. |
| 2021/0158860 A1 | 5/2021 | Wu et al. |
| 2021/0158861 A1 | 5/2021 | Jeong et al. |
| 2021/0201984 A1 | 7/2021 | Khasawneh et al. |
| 2021/0225432 A1 | 7/2021 | Enomoto et al. |

(56) References Cited

U.S. PATENT DOCUMENTS

| | | | |
|---|---|---|---|
| 2021/0241810 A1 | 8/2021 | Hollis et al. | |
| 2021/0265504 A1 | 8/2021 | Ishizu et al. | |
| 2021/0343324 A1 | 11/2021 | Brown et al. | |
| 2021/0350844 A1 | 11/2021 | Morohashi et al. | |
| 2021/0398592 A1 | 12/2021 | Penney et al. | |
| 2021/0407583 A1 | 12/2021 | Penney et al. | |
| 2022/0068348 A1 | 3/2022 | Bennett et al. | |
| 2022/0069992 A1 | 3/2022 | Ayyapureddi | |
| 2022/0165347 A1 | 5/2022 | Pan | |
| 2022/0230672 A1 | 7/2022 | Ayyapureddi et al. | |
| 2022/0293166 A1 | 9/2022 | Ayyapureddi et al. | |
| 2022/0415427 A1 | 12/2022 | Pan | |
| 2023/0010619 A1 | 1/2023 | Ayyapureddi et al. | |
| 2023/0047007 A1 | 2/2023 | Lovett | |
| 2023/0170008 A1 | 6/2023 | Zhang et al. | |
| 2023/0205428 A1* | 6/2023 | Kim | G06F 3/0653 711/105 |
| 2023/0206989 A1 | 6/2023 | He et al. | |

FOREIGN PATENT DOCUMENTS

| | | |
|---|---|---|
| CN | 1371100 A | 9/2002 |
| CN | 101038785 A | 9/2007 |
| CN | 101067972 A | 11/2007 |
| CN | 101331554 A | 12/2008 |
| CN | 101346775 A | 1/2009 |
| CN | 101458658 A | 6/2009 |
| CN | 101595528 A | 12/2009 |
| CN | 101622607 A | 1/2010 |
| CN | 102074268 A | 5/2011 |
| CN | 102113058 A | 6/2011 |
| CN | 102364991 A | 2/2012 |
| CN | 102483952 A | 5/2012 |
| CN | 103366808 A | 10/2013 |
| CN | 103544987 A | 1/2014 |
| CN | 103928048 A | 7/2014 |
| CN | 104350546 A | 2/2015 |
| CN | 105493188 A | 4/2016 |
| CN | 105814636 A | 7/2016 |
| CN | 106710621 A | 5/2017 |
| CN | 107256717 A | 10/2017 |
| CN | 107871516 A | 4/2018 |
| CN | 108122581 A | 6/2018 |
| CN | 108154895 A | 6/2018 |
| CN | 109074305 A | 12/2018 |
| CN | 109074305 B | 7/2023 |
| JP | H0773682 A | 3/1995 |
| JP | H10241385 A | 9/1998 |
| JP | 2005-216429 A | 8/2005 |
| JP | 2011-258259 A | 12/2011 |
| JP | 4911510 B2 | 1/2012 |
| JP | 2013-004158 A | 1/2013 |
| KR | 20150002112 A | 1/2015 |
| KR | 20150002783 A | 1/2015 |
| KR | 20170058022 A | 5/2017 |
| KR | 20180064940 A | 6/2018 |
| KR | 1020180064940 A | 6/2018 |
| KR | 1020180085184 A | 7/2018 |
| KR | 20190048049 A | 5/2019 |
| WO | 2014120477 | 8/2014 |
| WO | 2015030991 A1 | 3/2015 |
| WO | 2017171927 A1 | 10/2017 |
| WO | 2018217582 A2 | 11/2018 |
| WO | 2019222960 A1 | 11/2019 |
| WO | 2020010010 A1 | 1/2020 |
| WO | 2020191222 A1 | 9/2020 |
| WO | 2021003085 A1 | 1/2021 |
| WO | 2022108808 A1 | 5/2022 |

OTHER PUBLICATIONS

Kim et al., Semiconductor Memory Apparatus, Dec. 27, 2021 (KR 10-2021-0188869, published as US 2023/0205428) (Year: 2021).*

International Application No. PCT/US20/23689, titled "Semiconductor Device Having Cam That Stores Address Signals", dated Mar. 19, 2020; all pages of application as filed.

U.S. Appl. No. 15/884,192 entitled 'Semiconductor Device Performing Row Hammer Refresh Operation' filed Jan. 30, 2018; all pages of application as filed.

U.S. Appl. No. 16/797,658, titles "Apparatuses and Methods for Controlling Refresh Operations", filed Feb. 21, 2020; all pages of application as filed.

U.S. Appl. No. 16/818,981 titled "Apparatuses and Methods for Staggered Timing of Targeted Refresh Operations" filed Mar. 13, 2020; all pages of application as filed.

U.S. Appl. No. 16/824,460, titled "Semiconductor Device Performing Row Hammer Refresh Operation", dated Mar. 19, 2020; all pages of application as filed.

U.S. Appl. No. 16/025,844, titled "Apparatus and Methods for Triggering Row Hammer Address Sampling", filed Jul. 2, 2018; all pages of application as filed.

U.S. Appl. No. 16/783,063, titled "Apparatus and Methods for Triggering Row Hammer Address Sampling", dated Feb. 5, 2020; all pages of application as filed.

U.S. Appl. No. 16/805,197, titled "Apparatuses and Methods for Calculating Row Hammer Refresh Addresses in a Semiconductor Device", dated Feb. 28, 2020; all pages of application as filed.

U.S. Appl. No. 16/232,837, titled "Apparatuses and Methods for Distributed Targeted Refresh Operations", filed Dec. 26, 2018; all pages of application as filed.

U.S. Appl. No. 16/818,989, titled "Semiconductor Device Performing Row Hammer Refresh Operation", dated Mar. 13, 2020; all pages of application as filed.

U.S. Appl. No. 16/268,818, titled "Apparatuses and Methods for Managing Row Access Counts", filed Feb. 6, 2019; all pages of application as filed.

U.S. Appl. No. 16/286,187 titled "Apparatuses and Methods for Memory Mat Refresh Sequencing" filed Feb. 26, 2019; all pages of application as filed.

U.S. Appl. No. 16/084,119, titled "Apparatuses and Methods for Pure-Time, Self Adopt Sampling for Row Hammer Refresh Sampling", filed Sep. 11, 2018; all pages of application as filed.

U.S. Appl. No. 16/886,284 titled "Apparatuses and Methods for Access Based Refresh Timing" filed May 28, 2020; all pages of application as filed.

U.S. Appl. No. 16/886,284, titled "Apparatuses and Methods for Access Based Refresh Timing", dated May 28, 2020; all pages of application as filed.

U.S. Appl. No. 16/358,587, titled "Semiconductor Device Having Cam That Stores Address Signals", dated Mar. 19, 2019; all pages of application as filed.

U.S. Appl. No. 16/375,716 titled "Apparatuses and Methods for Staggered Timing of Targeted Refresh Operations" filed Apr. 4, 2019; all pages of application as filed.

U.S. Appl. No. 16/936,297 titled "Apparatuses and Methods for Managing Row Access Counts" filed Jul. 22, 2020; all pages of application as filed.

U.S. Appl. No. 16/411,573 titled "Apparatuses, Systems, and Methods for a Content Addressable Memory Cell" filed May 14, 2019; all pages of application as filed.

U.S. Appl. No. 16/428,625 titled "Apparatuses and Methods for Tracking Victim Rows" filed May 31, 2019; all pages of application as filed.

U.S. Appl. No. 16/513,400 titled "Apparatuses and Methods for Tracking Row Accesses" filed Jul. 16, 2019; all pages of application as filed.

U.S. Appl. No. 17/060,403 titled "Apparatuses and Methods for Adjusting Victim Data" filed Oct. 1, 2020; all pages of application as filed.

U.S. Appl. No. 16/548,027 titled "Apparatuses, Systems, and Methods for Analog Row Access Rate Determination" filed Aug. 22, 2019; all pages of application as filed.

U.S. Appl. No. 16/549,942 titled "Apparatuses and Methods for Lossy Row Access Counting" filed Aug. 23, 2019; all pages of application as filed.

(56) References Cited

OTHER PUBLICATIONS

U.S. Appl. No. 16/546,152 titled "Apparatuses and Methods for Analog Row Access Tracking" filed Aug. 20, 2019; all pages of application as filed.
U.S. Appl. No. 16/549,411 titled "Apparatuses and Methods for Dynamic Refresh Allocation" filed Aug. 23, 2019; all pages of application as filed.
U.S. Appl. No. 16/655,110 titled "Apparatuses and Methods for Dynamic Targeted Refresh Steals" filed Oct. 16, 2019; all pages of application as filed.
U.S. Appl. No. 17/154,945 titled "Apparatuses, Systems, and Methods for a Content Addressable Memory Cell" filed Jan. 21, 2021; all pages of application as filed.
U.S. Appl. No. 17/170,616 titled "Apparatuses, Systems, and Methods for Analog Row Access Rate Determination" filed Feb. 8, 2021; all pages of application as filed.
U.S. Appl. No. 17/168,036 titled "Apparatuses and Methods for Analog Row Access Tracking" filed Feb. 4, 2021; all pages of application as filed.
U.S. Appl. No. 17/301,533 titled "Semiconductor Device Having Cam That Stores Address Signals" filed Apr. 6, 2021; all pages of application as filed.
U.S. Appl. No. 17/443,056 titled "Apparatuses and Methods for Multiple Row Hammer Refresh Address Sequences" filed Jul. 20, 2021; all pages of application as filed.
U.S. Appl. No. 17/446,710 titled "Apparatuses, Systems, and Methods for Determining Extremum NumericalValues" filed Sep. 1, 2021; all pages of application as filed.
International Application No. PCT/US19/40169 titled "Apparatus and Methods for Triggering Row Hammer Address Sampling" filed Jul. 1, 2019; all pages of application as filed.
International Application No. PCT/US19/64028, titled "Semiconductor Device Performing Row Hammer Refresh Operation", dated Dec. 2, 2019; all pages of application as filed.
International Application No. PCT/US20/26689, titled "Apparatuses and Methods for Staggered Timing of Targeted Refresh Operations", dated Apr. 3, 2020; all pages of application as filed.
International Application No. PCT/US20/40077, titled "Apparatuses and Methods for Monitoring Word Line Accesses", dated Jun. 29, 2020; all pages of application as filed.
U.S. Appl. No. 17/375,817 titled "Apparatuses and Methods for Monitoring Word Line Accesses" filed Jul. 14, 2021; all pages of application as filed.
U.S. Appl. No. 16/788,657, titled "Semiconductor Device Performing Row Hammer Refresh Operation", dated Feb. 12, 2020; all pages of application as filed.
U.S. Appl. No. 15/881,256 entitled 'Apparatuses and Methods for Detecting a Row Hammer Attack With a Bandpass Filter' filed Jan. 26, 2018; all pages of application as filed.
U.S. Appl. No. 16/425,525 titled "Apparatuses and Methods for Tracking All Row Accesses" filed May 29, 2019; all pages of application as filed.
U.S. Appl. No. 16/427,105 titled "Apparatuses and Methods for Priority Targeted Refresh Operations" filed May 30, 2019; all pages of application as filed.
U.S. Appl. No. 16/427,140 titled "Apparatuses and Methods for Tracking Row Access Counts Between Multiple Register Stacks" filed May 30, 2019; all pages of application as filed.
U.S. Appl. No. 16/437,811 titled "Apparatuses, Systems, and Methods for Determining Extremum Numerical Values" filed Jun. 11, 2019; all pages of application as filed.
U.S. Appl. No. 16/537,981 titled "Apparatuses and Methods for Controlling Targeted Refresh Rates" filed Aug. 12, 2019; all pages of application as filed.
U.S. Appl. No. 17/007,069 titled "Apparatuses and Methods for Providing Refresh Addresses" filed Aug. 31, 2020; all pages of application as filed.
U.S. Appl. No. 17/153,555 titled "Apparatuses and Methods for Dynamically Allocated Aggressor Detection" filed Jan. 20, 2021; all pages of application as filed.
U.S. Appl. No. 17/201,941 titled "Apparatuses and Methods for Sketch Circuits for Refresh Binning" filed Mar. 15, 2021; all pages of application as filed.
U.S. Appl. No. 17/444,925 titled "Apparatuses and Methods for Countering Memory Attacks" filed Aug. 12, 2021; all pages of application as filed.
U.S. Appl. No. 17/456,849 titled "Apparatuses, Systems, and Methods for Main Sketch and Slim Sketch Circuitfor Row Address Tracking" filed Nov. 29, 2021; all pages of application as filed.
U.S. Appl. No. 17/470,883 titled "Apparatuses and Methods for Tracking Victim Rows" filed Sep. 9, 2021; all pages of application as filed.
U.S. Appl. No. 15/789,897, entitled "Apparatus and Methods for Refreshing Memory", filed Oct. 20, 2017; all pages of application as filed.
U.S. Appl. No. 15/796,340, entitled: "Apparatus and Methods for Refreshing Memory" filed Oct. 27, 2017; all pages of application as filed.
U.S. Appl. No. 16/012,679, titled "Apparatuses and Methods for Multiple Row Hammer Refresh Address Sequences", filed Jun. 19, 2018; all pages of application as filed.
U.S. Appl. No. 16/020,863, titled "Semiconductor Device", filed Jun. 27, 2018; all pages of application as filed.
U.S. Appl. No. 16/112,471 titled "Apparatuses and Methods for Controlling Refresh Operations" filed Aug. 24, 2018; all pages of application as filed.
U.S. Appl. No. 16/160,801, titled "Apparatuses and Methods for Selective Row Refreshes" filed Oct. 15, 2018; all pages of application as filed.
U.S. Appl. No. 16/176,932, titled "Apparatuses and Methods for Access Based Refresh Timing", filed Oct. 31, 2018; all pages of application as filed.
U.S. Appl. No. 16/208,217, titled "Semiconductor Device Performing Row Hammer Refresh Operation", filed Dec. 3, 2018; all pages of application as filed.
U.S. Appl. No. 16/230,300, titled "Apparatuses and Methods for Staggered Timing of Targeted Refresh Operations" filed Dec. 21, 2018; all pages of application as filed.
U.S. Appl. No. 16/231,327 titled "Apparatuses and Methods for Selective Row Refreshes", filed Dec. 21, 2018; all pages of application as filed.
U.S. Appl. No. 16/237,291, titled "Apparatus and Methods for Refreshing Memory", filed Dec. 31, 2018; all pages of application as filed.
U.S. Appl. No. 16/290,730, titled "Semiconductor Device Performing Row Hammer Refresh Operation", filed Mar. 1, 2019; all pages of application as filed.
U.S. Appl. No. 16/374,623, titled "Semiconductor Device Performing Row Hammer Refresh Operation", filed Apr. 3, 2019; all pages of application as filed.
U.S. Appl. No. 16/411,698 title "Semiconductor Device" filed May 14, 2019; all pages of application as filed.
U.S. Appl. No. 16/427,330 titled "Apparatuses and Methods for Storing Victim Row Data" filed May 30, 2019; all pages of application as filed.
U.S. Appl. No. 16/431,641 titled "Apparatuses and Methods for Controlling Steal Rates" filed Jun. 4, 2019; all pages of application as filed.
U.S. Appl. No. 16/682,606, titled "Apparatuses and Methods for Distributing Row Hammer Refresh Events Across a Memory Device", filed Nov. 13 2019; all pages of application as filed.
U.S. Appl. No. 17/102,266, titled "Apparatuses and Methods for Tracking Word Line Accesses", dated Nov. 23, 2020; all pages of application as filed.
U.S. Appl. No. 15/876,566 entitled 'Apparatuses and Methods for Calculating Row Hammer Refresh Addresses in a Semiconductor Device' filed Jan. 22, 2018; all pages of application as filed.
International Application for Application No. PCT/US20/32684, titled "Apparatuses, Systems, and Methods for a Content Addressable Memory Cell", dated May 13, 2020; all pages of application as filed.

(56) References Cited

OTHER PUBLICATIONS

U.S. Appl. No. 15/656,084 titled "Apparatuses and Methods for Targeted Refreshing of Memory", filed Jul. 21, 2017; all pages of application as filed.

U.S. Appl. No. 16/459,520 titled "Apparatuses and Methods for Monitoring Word Line Accesses", filed Jul. 1, 2019; all pages of application as filed.

PCT Application No. PCT/US18/55821 "Apparatus and Methods for Refreshing Memory" filed Oct. 15, 2018; all pages of application as filed.

U.S. Appl. No. 15/715,846, entitled "Semiconductor Device", filed Sep. 26, 2017; all pages of application as filed.

U.S. Appl. No. 15/888,993, entitled "Apparatuses and Methods for Controlling Refresh Operations", filed Feb. 5, 2018; all pages of application as filed.

U.S. Appl. No. 16/190,627 titled "Apparatuses and Methods for Targeted Refreshing of Memory" filed Nov. 14, 2018; all pages of application as filed.

U.S. Appl. No. 16/459,507 titled "Apparatuses and Methods for Adjusting Victim Data", filed Jul. 1, 2019; all pages of application as filed.

U.S. Appl. No. 15/281,818, entitled: "Semiconductor Device" filed Sep. 30, 2016; all pages of application as filed.

Kim, et al., "Flipping Bits in MemoryWithout Accessing Them: An Experimental Study of DRAM Disturbance Errors", IEEE, Jun. 2014, 12 pgs.

Stout, Thomas et al., "Voltage Source Based Voltage-to-Time Converter", IEEE, downloaded Jul. 2020, p. All.

U.S. Appl. No. 17/822,033, titled, "Apparatuses and Methods for Tracking Word Line Accesses" filed Aug. 24, 2022, pp. all pages of applciation as filed.

U.S. Appl. No. 17/565,187 titled "Apparatuses and Methods for Row Hammer Counter Mat" filed Dec. 29, 2021.

U.S. Appl. No. 17/932,206, titled, "Apparatuses and Methods for Dynamically Allocated Aggressor Detection" filed Sep. 14, 2022; pp. all pages of application as filed.

[English Abstract] Zheng, Bin , et al., "Design of Built-in DRAM for TFT-LCD Driver Chip LCD and display," Issue 4, Aug. 15, 2009; pp. all.

U.S. Appl. No. 18/741,485 titled "Apparatuses and Methods for Aggressor Queue Based Mitigation Threshold" filed Jun. 12, 2024, pp. all pages of the application as filed.

U.S. Appl. No. 18/743,783 titled "Apparatuses and Methods for Per-Row Count Based Refresh Target Identification" filed Jun. 14, 2024, pp. all pages of the application as filed.

U.S. Appl. No. 18/744,988 titled "Apparatuses and Methods for Per-Row Count Based Refresh Targetidentification With Sorting" filed Jun. 17, 2024, pp. all pages of the application as filed.

U.S. Appl. No. 18/745,068 titled "Apparatuses and Methods for Per Row Activation Counter Testing" filed Jun. 17, 2024, pp. all pages of the application as filed.

\* cited by examiner

APPARATUSES AND METHODS FOR ROW HAMMER COUNTER MAT

BACKGROUND

Information may be stored on memory cells of a memory device. The memory cells may be organized at the intersection of word lines (rows) and bit lines (columns). During an access operation, a word line may be activated and data may be read out from the memory cells along the bit lines to sense amplifiers, which may detect the information stored in the memory cells. Information may degrade over time, and so the memory cells may need to be periodically refreshed (e.g., on a row by row basis). Certain access patterns, such as frequent accesses to a single row, may increase the rate of decay in nearby memory cells. Accordingly, it may be important to locate rows experiencing these access patterns in order to perform targeted refresh operations on nearby memory cells.

DETAILED DESCRIPTION

Figure 1:
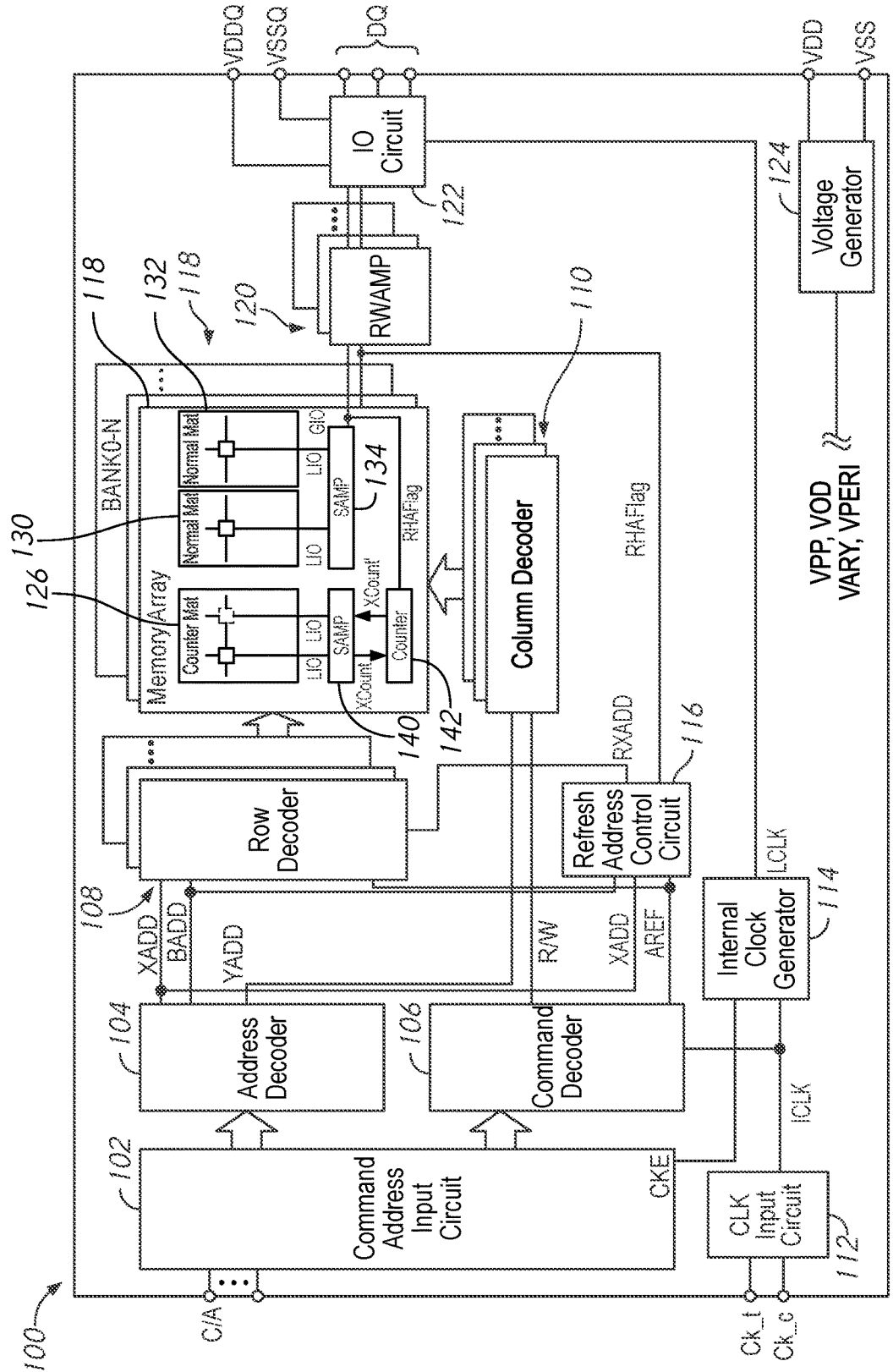
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

The memory may perform periodic refresh operations, such as auto-refresh operations, to prevent information from being lost. For example, during each auto-refresh operation, the memory may refresh one or more rows of memory to restore the information stored therein (e.g., by restoring an amount of charge on a capacitive storage element). The memory may cycle through the rows of the array such that over the course of a refresh cycle each row is refreshed. The timing of refresh operations may be set such that each row is refreshed more frequently than the timing at which the signal in the memory cell decays to the point where information is lost.

Certain access patterns to rows of the memory (aggressor rows) may cause an increased rate of decay in nearby rows of the memory (victim rows). Accordingly, since the victim rows may decay faster than the assumed rate of decay used to set the timing of auto-refresh operations, there is a risk that information in the victim rows could be lost. To keep track of which rows are aggressors so that victims can be identified, the memory may track a number of accesses to each row of the memory. To efficiently utilize space, the count values may be stored directly in the memory array. However, this may introduce timing problems, since for each access operation to a row of memory, the count will need to be read, changed, and then written back to the memory array. It may be useful to store the count values in the memory array in a manner to reduce the timing of this read-change-write cycle compared to the timing of a normal access operation.

The present disclosure is drawn to apparatuses, systems, and methods for row hammer counter mats. The memory array may be divided into banks, and each bank may be further subdivided into a number of sections or mats. Each mat is separated from adjacent mats by a sense amplifier region, which includes sense amplifiers coupled to bit lines of the mat. The array includes a counter mat which stores access count values for the other rows of the memory bank. The counter mat may be positioned at an edge of the bank (e.g., between a final "normal" mat and the bank logic). During an access operation to one of the rows in a normal mat, a count value stored in the counter mat is read, changed (e.g., incremented), compared to a threshold to determine if the associated row is an aggressor, and then written back to the counter mat. The memory cells of the counter mat may have a larger sense margin than the memory cells of the normal mats, which may increase the speed at which the memory cells of the counter mat can be operated. For example, since the count values for a bank may represent fewer bits than the data normally stored in a mat, the counter mat may have fewer word lines than a normal mat. Accordingly, the counter mat may have shorter digit lines, which may increase the access speed of the counter mat. Additionally (or instead), the counter mat may be close to the bank logic, which may also speed up the read-change-write cycle.

The counter mat may have a different function than normal memory mats. For example, the counter mat may have counter logic such that when a row address and set of columns are activated, the count in the specified memory cells is read, changed (e.g., incremented) and checked to determine if the changed count is above a threshold all within the memory mat (e.g., without the count value being read out along a global input/output line). Each counter may provide a flag signal out to the bank logic which indicates if the count read out to that counter is above the threshold. Accordingly, each access in the counter mat may provide a flag signal (e.g., a one bit output) which indicates if the current address is a row hammer address or not. This may simplify the management of the count values in the counter mat.

In some embodiments, the counter mat may have a different architecture than the normal memory mats. For example, normal memory mats may use an open-ended digit line architecture, where alternating digit lines are coupled to different sense amplifier regions, and each sense amplifier region includes sense amplifiers coupled to digit lines in the two adjacent memory mats. The counter mat may use a folded digit line architecture, where two digit lines in the counter mat are coupled to the same sense amplifier.

In an example folded architecture, the digit lines may alternate, with each pair of even digit lines coupled to a sense amplifier and each pair of odd digit lines coupled to a sense amplifier. Out of each pair, along a given word line, one of the pair may not be coupled to a memory cell. The sense amplifier region may include a row of 'odd sense amplifiers' including the sense amplifiers coupled to the odd digit line pairs, and a row of 'even sense amplifiers' including the sense amplifiers coupled to the even digit line pairs. Since one of the rows of sense amplifiers will be 'behind' the other from the perspective of the digit lines, jumpers may be used to couple the back row of sense amplifiers. For example, if the even sense amplifiers are behind, then even digit lines may be coupled to jumpers in a metal layer above the odd sense amplifier and odd digit lines so that the even digit lines pass over the odd sense amplifier region before coupling to the even sense amplifier row.

Another example folded digit line architecture may involve shorting two digit lines together and coupling them to an input of each sense amplifier. Each sense amplifier may have two inputs, and one input may be coupled to two memory cells along two digit lines. The other input is coupled to a system voltage (e.g., a reference voltage) through a capacitor which mimics the capacitance along the digit line.

While the folded architectures of the present disclosure may be described with respect to use as part of a counter memory mat, it should be understood that the folded architectures described herein are not limited to that application. For example, the even/odd folded architecture and/or shorted digit line architecture described herein may be used in a "normal" memory mat used to store data. Similarly, while certain advantages may be offered by positioning such memory mats at the edge of a bank, the invention is not limited to placing counter memory mats (and/or folded digit line mats used for other purposes) at the edge of the memory array (e.g., near the bank logic). Such memory mats may be positioned anywhere in other example embodiments.

The folded digit line architecture and counter logic in the mat may be used together, or may be used separately. For example, a counter memory mat may use the folded digit line architecture, but may not include counter circuits, and may read out binary values to the bank logic, which are updated and compared to thresholds within the bank logic before being written back. Similarly, a counter memory mat may include counter logic within the sense amplifier regions of that mat, even if the counter mat uses an open-ended architecture.

FIG. 1 is a block diagram of a semiconductor device according to at least one embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL (rows), a plurality of bit lines BL (columns), and a plurality of memory cells MC arranged at intersections of the plurality of word lines WL and the plurality of bit lines BL. Each memory bank may be divided into a number of sections or 'mats', such as mat 130 and mat 132. Each memory mat includes a number of memory cells, word lines and bit lines. The mats may be separated from each other by sense amplifier regions, which include the sense amplifiers (e.g., 134) which are coupled to memory cells in the adjacent mats.

The memory device also includes a counter mat 126 which may store a number of count values XCount, each of which is associated with a row in one of the 'normal' mats 130. Similar to the normal mats 130 and 132, the counter mat 126 includes a number of memory cells, bit lines, and word lines. The memory cells in the counter mat 126 may be used to store a number of values, XCount, each which represents a number of accesses to a row in a normal mat 130 and 132. For example, if the number XCount is an N bit binary number, and there are M total rows in the rest of the memory array 118, then the counter mat 126 may include at least N*M total memory cells. A given word line of the counter mat 126 may include multiple XCounts, each associated with a different row. The counter mat 126 may be coupled to the refresh address control circuit 116.

The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. The bit lines BL are coupled to a respective sense amplifier (SAMP) 134. Read data from the bit line BL is amplified by the sense amplifier SAMP 134, and transferred to read/write amplifiers 120 over local input/output lines (LIO), transfer gate (TG), and global input/output lines (GIO). Conversely, write data outputted from the read/write amplifiers 120 is transferred to the sense amplifier SAMP over the GIO, the transfer gate TG, and the LIO, and written in the memory cell MC coupled to the bit line BL.

In some embodiments, the counter memory mat 126 may have a different sense amplifier/bit line architecture than the normal mats 130 and 132. For example, the normal mats 130 and 132 may utilize an open-ended architecture, while the counter mat 126 may use a folded architecture. In an open-ended architecture, each sense amplifier coupled to a normal mat, such as SAMP 134, has a first input coupled along an LIO to a bit line in a first normal mat 130, and a second input coupled along a second LIO to a second bit line in a second normal mat 132. During access operations, one of the two mats may be activated, and the other may provide a reference voltage.

In a folded architecture, each sense amplifier, such as SAMP 140, is coupled to a single memory mat, such as the counter mat 126. In one example folded architecture, the SAMP 140 has a first input coupled to a bit line which intersects an active word line at a memory cell and a second input coupled to a bit line which intersects the active word line not at a memory cell. In another example folded architecture, two bit lines, each intersecting a memory cell along the active word line, are shorted together and coupled to a first input of the SAMP 140, while a second input is coupled to a reference voltage. Example folded architectures and sense amplifiers are described in more detail in FIGS. 4-10.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a row activation command ACT. When the row activation command ACT is received, a bank address BADD and a row address XADD are timely supplied with the row activation command ACT.

Each time a row is selected and activated (e.g., with XADD and ACT), row and column addresses for the counter mat 126 are also generated to retrieve the value XCount associated with that word line. For example, the memory 100 may include a mapping engine (not shown) which receives the row address XADD and generates a counter address including word line and bit line addresses for the memory cells of the counter mat 126 which store the value XCount associated with the word line specified by XADD. Accordingly, the counter address generated in response to the row address XADD may include both row (word line) and column (bit line) address components. As described in more detail herein, the address XADD may be determined to be an aggressor based on the count XCount. For example, in some embodiments, the count may be retrieved and checked by a refresh control circuit 116.

In some embodiments, logic, such as counter 142, within the memory array may check the count and a flag signal indicating if the current count is over the threshold may be read out. The counter 142 and sense amplifiers 140 may be access logic located in a sense amplifier region within the memory array 118, while the refresh control circuit 116 is located in a bank logic region outside the memory array. In embodiments using a counter 142, the value of the count XCount may remain within the memory array 118. For example, the value XCount may be read out along local input/output (LIO) lines to the sense amplifiers 140 and counter circuit 142. The counter may update the value and write it back along the LIO lines, and provide a flag RHAFlag along global input/output (GIO) lines to the refresh control circuit 116. In some embodiments, each counter circuit 142 may be coupled to a number of sense amplifiers 140 (and through them bit lines and memory cells) which are activated by a common portion of the counter address, such as a column select signal. For example, if a column select signal of the counter address activates 8 sense amplifiers and bit lines, then XCount may be an 8-bit number read out to a counter circuit 142. More or fewer activated bit lines and more or fewer bits of XCount may be used in other example embodiments.

The device 100 may receive an access command which is a read command. When a read command is received, a bank address BADD and a column address YADD are timely supplied with the read command, read data is read from memory cells in the memory array 118 corresponding to the row address XADD and column address YADD. The read command is received by the command decoder 106, which provides internal commands so that read data from the memory array 118 is provided to the read/write amplifiers 120. The read data is output to outside from the data terminals DQ via the input/output circuit 122. The access count XCount stored in the counter mat 126 which is associated with the row address XADD are retrieved, updated, and checked against a threshold. If the updated value XCount' is less than the threshold, then it is written back to the counter mat 126. If the updated value XCount' is greater than or equal to the threshold, then the current address XADD is flagged as an aggressor and the value XCount' is reset to an initial value (e.g., 0).

The device 100 may receive an access command which is a write command. When the write command is received, a bank address BADD and a column address YADD are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC. Similar to the read operation described above, the access count Xcount associated with the row address XADD are retrieved, updated, and the updated value XCount' is written back.

The device 100 may also receive commands causing it to carry out refresh operations. The refresh signal AREF may be a pulse signal which is used to control the timing of refresh operations. For example, the signal AREF may be activated when the command decoder 106 receives a signal which indicates an auto-refresh command. In some embodiments, the auto-refresh command may be externally issued to the memory device 100. In some embodiments, the auto-refresh command may be periodically generated by a component of the device. In some embodiments, when an external signal indicates a self-refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an idle state.

The refresh signal AREF is supplied to the refresh control circuit 116. The refresh control circuit 116 supplies a refresh row address RXADD to the row decoder 108, which may refresh a wordline WL indicated by the refresh row address RXADD. The refresh control circuit 116 may determine a type of the refresh operation, and may generate and provide the refresh address RXADD. The refresh control circuit 116 may be controlled to change details of the refreshing address RXADD (e.g., how the refresh address is calculated, the timing of the refresh addresses), and/or may operate based on internal logic.

The refresh control circuit 116 may selectively output a targeted refresh address (e.g., a victim address) or an automatic refresh address (auto-refresh address) as the refreshing address RXADD. The automatic refresh addresses may be a sequence of addresses which are provided based on activations of the auto-refresh signal AREF. The refresh address control circuit 116 may cycle through the sequence of auto-refresh addresses at a rate determined by AREF. In some embodiments, the sequence of auto-refresh addresses may include all the addresses in the memory bank 118. In some embodiments, the auto-refresh signal AREF may be issued with a frequency such that most or all of the addresses in the memory bank 118 are refreshed within a certain period, which may be based on an expected rate at which information in the memory cells MC decays.

The refresh address control circuit 116 may also determine targeted refresh addresses which are addresses that require refreshing (e.g., victim addresses corresponding to victim rows) based on the access pattern of nearby addresses (e.g., aggressor addresses associated with aggressor rows) in the memory array 118. The refresh address control circuit 116 may monitor accesses to the different wordlines WL of the memory bank. When the row decoder 108 sends an access command to a particular row, the count value XCount associated with that row is used to determine if the accessed row is an aggressor or not.

The refresh address control circuit 116 may determine if the accessed row is an aggressor row based on the access count from the counter memory mat 126. If the current row is not an aggressor row, the value of the access count may be changed (e.g., incremented) and written back to the counter memory cells 126 of the accessed row. If the refresh address control circuit 116 determines that the accessed row is an aggressor, then the refresh address control circuit 116 may use the row address XADD of the accessed row to determine one or more victim row addresses and provide them as a refresh address RXADD as part of a targeted refresh operation. When the accessed row is determined to be an aggressor, the access count Xcount associated with that row may be reset (e.g., to a minimum value, such as 0). In some embodiments, the refresh address control circuit 116 may queue up identified aggressor addresses (e.g., in a register) for later use in targeted refresh operations.

The refresh address RXADD may be provided with a timing based on a timing of the refresh signal AREF. The refresh address control circuit 116 may have time slots corresponding to the timing of AREF, and may provide one or more refresh addresses RXADD during each time slot. In some embodiments, the targeted refresh address may be issued in (e.g., "steal") a time slot which would otherwise have been assigned to an auto-refresh address. In some embodiments, certain time slots may be reserved for targeted refresh addresses, and the refresh address control circuit 116 may determine whether to provide a targeted refresh address, not provide an address during that time slot, or provide an auto-refresh address instead during the time slot.

The targeted refresh address may be based on access characteristics over time of the row addresses XADD received from the address decoder 104. For example, the access characteristics may be determined based on the value of the access count Xcount stored in the counter mat 126. The refresh address control circuit 116 may use different methods to calculate a targeted refresh address based on a row address XADD identified as an aggressor address based on the access count. For example, the refresh address control circuit 116 may determine if a given row is an aggressor address, and then calculate and provide addresses corresponding to victim addresses of the aggressor address as the targeted refresh address. In some embodiments, more than one victim address may correspond to a given aggressor address. In this case the refresh address control circuit may queue up multiple targeted refresh addresses, and provide them sequentially when it determines that a targeted refresh address should be provided. The refresh address control circuit 116 may provide the targeted refresh address right away, or may queue up the targeted refresh address to be provided at a later time (e.g., in the next time slot available for a targeted refresh).

In some embodiments, the count value XCount may not leave the memory array 118. Instead, the count value may be updated by logic within the memory array 118, such as counter circuit 142. The sense amp 140 may read the bits of XCount from the counter mat 126 and provide those bits to counter 142, which may update the value (e.g., by incrementing) to XCount'. Based on the updated value, a signal RHAFlag may be provided along a GIO line to the refresh control circuit. The signal RHAFlag may be a one bit signal, which is active if the current address is an aggressor (e.g., if XCount' meets or exceeds a threshold) and inactive otherwise. In some embodiments, the value RHAFlag may reflect a state of a most significant bit of the count XCount, and thus the number of bits of XCount may determine the threshold value.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
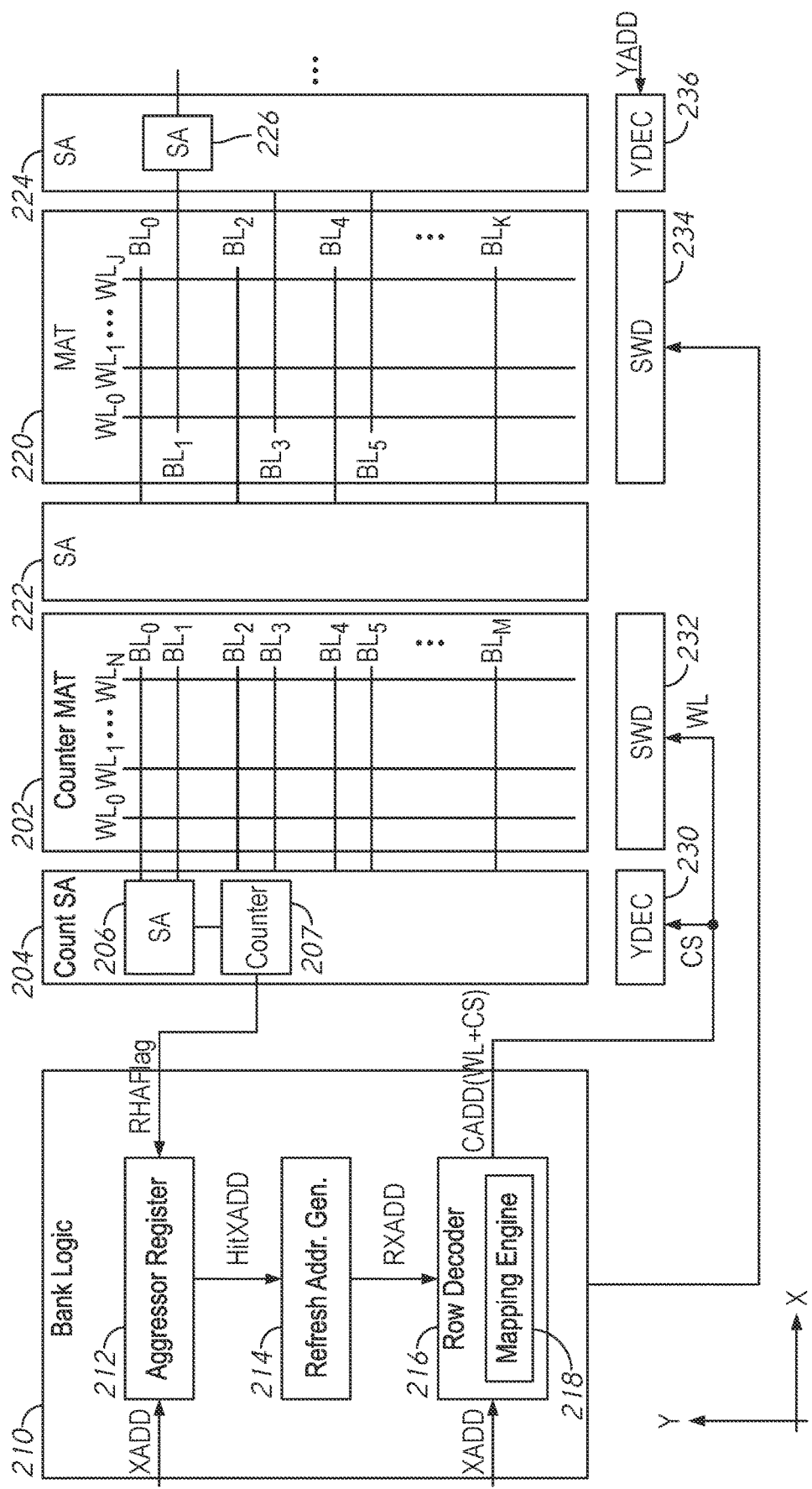
FIG. 2 is a block diagram of a memory device according to some embodiments of the present disclosure.

FIG. 2 is a block diagram of a memory device according to some embodiments of the present disclosure. The memory device 200 may, in some embodiments, represent an example layout of a portion of the memory device 100 of FIG. 1. The memory device 200 is a simplified view showing certain components, signals, and addresses useful for describing the operation of a counter memory mat 202 and its sense amplifier region 204.

The memory 200 shows a portion of a memory array and its associated logic. In particular, the view of FIG. 2 shows a portion of a single memory bank, and a portion of the logic circuits 210 associated with that bank. The components shown in FIG. 2 may be repeated for each bank of a memory array (e.g., 118 of FIG. 1).

FIG. 2 shows two memory mats, a counter mat 202 and a normal mat 220. For clarity of illustration, only a single normal mat 220 is shown, however the bank may include additional memory mats similar to the normal mat 220 described herein. The other normal mats may extend in an X direction.

The counter mat 202 includes word lines $WL_0$ to $WL_N$ and bit line $BL_0$ to $BL_M$. Memory cells are disposed at the intersection of the word lines and bit lines for a total of $(N+1)*(M+1)$ memory cells. The memory cells of the counter mat 202 are used to store count values XCount. Each value XCount may be stored as an P-bit binary number. Hence, the counter mat 202 may store $((N+1)*(M+1))/P$ total count values XCount. Similarly, the normal mat 220 has word lines $WL_0$ to $WL_J$ and bit lines $BL_0$ to $BL_K$ for a total of $(J+1)*(K+1)$ memory cells. Although only one is shown, there may also be Q different normal mats in a given bank. The normal mat 220 is used to store various pieces of data.

There may be a value of XCount for each word line of the normal mats of the remainder of the bank. Accordingly, if there are Q mats, each with $(J+1)$ word lines, then the counter mat 202 stores $Q*(J+1)$ different values of XCount. This, in turn, may determine the size of counter memory mat 202. For example, it may be useful to keep the number of digit lines equal in the different mats (e.g., M=K). In an example layout where each mat includes 1.5 k word lines and 42 different normal mats, and each value XCount is 8 bits, then there will be 504 k values of XCount (1.5 k WLs*8 bits*42 mats). If each mat includes 4 k digit lines (e.g., bits per word line), then the counter mat 202 will include 126 word lines (504 k/4 k).

The counter mat 202 may be smaller than the normal mats 220. For example, the counter mat 202 may have fewer word lines (e.g., N<J). This may make the counter mat 202 thinner (e.g., shorter in an X direction) than the normal mats 220. With fewer word lines, the digit lines of the counter mat 202 may be shorter (e.g., in an X direction) than the digit lines of the normal mats 220. The counter mat 202 may have a same number of bit lines (e.g., M=K) as the normal mats 220 and may thus have a same height (e.g., size in the Y direction).

The normal memory mats 220 may use an open ended architecture where alternating bit lines are coupled to sense amplifiers in different sense amplifiers regions. The sense amplifier regions may be positioned between the memory mats. In this case, normal mat 220 is adjacent to sense amplifier region 222 (which is between mat 220 and counter mat 202) and sense amplifier region 224 (which is between mat 220 and a next mat, not shown). For example, in mat 220, even digit lines may couple to a sense amplifier in region 222, while odd digit lines may couple to a sense amplifier in region 224. Example sense amplifier 226 is shown in region 224, which is coupled to a bit line BL1 in mat 220 and to another digit line in a next mat (not shown).

The counter mat 202 may use a folded architecture, where the bit lines are coupled to a same sense amplifier region 204. Example sense amplifier 206 is shown coupled to two bit lines BL0 and BL1. Various schemes for folded digit line architectures are described in more detail in FIGS. 4-10. In some embodiments, a counter mat 202 may be used which uses an open-ended architecture similar to the normal mats 220.

The counter mat 202 may be along an edge of the memory bank, near to bank logic 210. The bank logic includes various circuits which operate the memory bank. For example, an aggressor register circuit 212 and refresh address generator 214 (e.g., parts of the refresh control circuit 118 of FIG. 1) may determine if an accessed word line address XADD is an aggressor address based on the value XCount stored in the counter mat 202 which is associated with that address XADD. When the bank logic 210 receives a row address XADD, a mapping engine 218 may generate a count address CADD which is associated with where the count value XCount associated with that row address is stored in the counter mat 202. For example, the mapping engine 218 may include a look up table which links each value of XADD to a row and set of columns in the counter mat 202. For example, each value of XADD may be linked to a group of memory cells specified by a word line and a column select signal (e.g., set of bit lines activated by a common column select signal) along that word line. Accordingly, each count address CADD may include a word line address and a CS address. Multiple values of XCount (e.g., for different word lines in the normal mat 220) may be stored along a single word line in the counter mat 202.

The mapping engine 218 may receive a row address XADD and break the row address down into a section address SEC and a word lines address WL. The section address SEC may specify one of the normal mats. The word line address WL specifies a word line within that mat. The mapping engine may have a look up table which translates the SEC and WL address into a CS address and counter WL address (e.g., a CADD) for the counter mat 202. The counter address CADD is provided to a column decoder 230, which uses the CS address to activate one or more bit lines of the counter mat 202 and to a sub word line driver SWD 232, which uses the counter WL address to activate a word line of the counter mat. The value XCount may be stored along the memory cells at the intersection of the activated word and bit lines.

The section address SEC and WL address decoded from the row address XADD are used to activate a word line in the normal mat 220. The section address SEC may determine which SWD 234 is activated, and the activated SWD 234 may use the WL address to activate a word line within the normal mat 220. Meanwhile, a column decoder 236 of the normal mat 220 receives a row address YADD and activates one or more bit lines based on that column address (e.g., based on a CS address decoded from the row address YADD). In other words the normal mat 220 has a word line activated by a row address and bit lines activated by column address. In contrast, the mapping engine 218 uses the row address to generate row and column addresses which are used to activate rows and columns of the counter mat 202.

In some embodiments, the number of bits of XCount may be chosen based on a number of bit lines activated by a column select signal (e.g., a section portion of a counter address CADD), by a desired row hammer threshold, or combinations thereof. In some embodiments, the address CADD may be a decoded address and may include signals which directly activate the word line and section specified by the mapping engine 218. Other methods of linking row addresses XADD and count addresses CADD may be used in other example embodiments.

The count address CADD is used to access the value XCount from the counter mat 202. In some embodiments, the value XCount may be read out to the aggressor register 212, which may modify, check and write back the value of XCount. In some embodiments, access logic of the counter mat 204 may include counter logic 207, which may modify, check and write back the value of XCount without the value XCount leaving the memory array. In embodiments including counter logic 207, then the value of XCount may remain in the counter mat 204 (e.g., may not be transmitted over a GIO line) and instead the counter 207 may generate a flag signal RHAFlag which is active if XCount meets or exceeds the threshold, and inactive otherwise. FIGS. 11-14 describe an example embodiment with a counter circuit and its operation in more detail.

The aggressor register 212 or the counter 207 changes the value XCount (e.g., by incrementing it) and compares that value to a threshold. If the value is less than the threshold, then the updated value XCount is written back to the counter mat 202. If the value is greater than (or equal to) the threshold, the value is reset (e.g., to 0) before being written back, and the current row address XADD is captured as an aggressor address HitXADD and stored in the aggressor register 212. If a counter 207 is used, then the address XADD is captured in response to the signal RHAFlag being active. The refresh address generator 214 generates one or more refresh addresses based on HitXADD stored in the register 212 (e.g., HitXADD+/−1, HitXADD+/−2, etc.). During a targeted refresh operation, the refresh address RXADD is provided to a row decoder 216, which in turn refreshes word lines in the normal mats 220 associated with the address RXADD.

Figure 3:
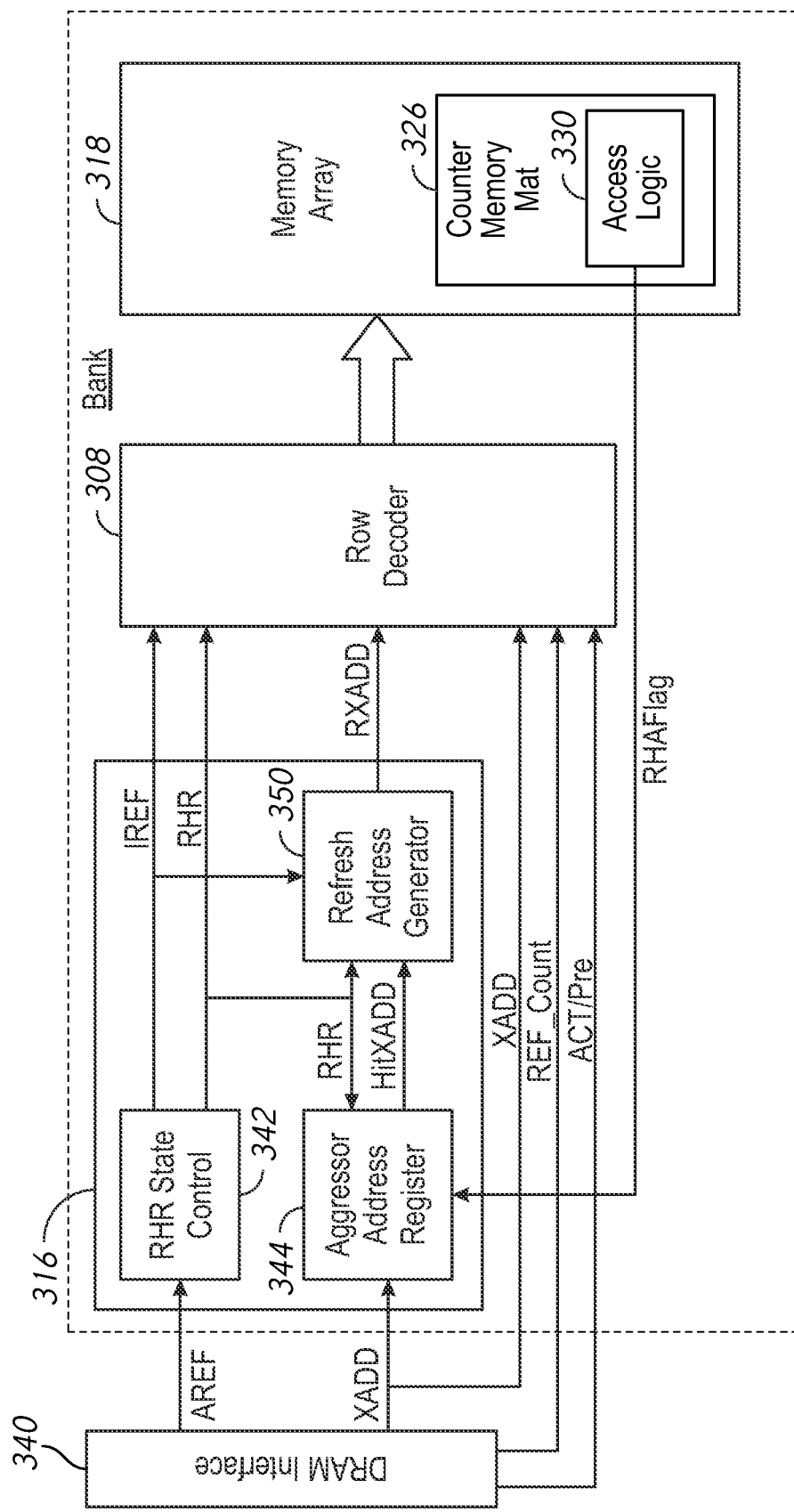
FIG. 3 is a block diagram of a refresh control circuit according to an embodiment of the present disclosure.

FIG. 3 is a block diagram of a refresh control circuit according to an embodiment of the present disclosure. In some embodiments, the refresh address control circuit 316 may be used to implement the refresh address control circuit 116 of FIG. 1. Certain internal components and signals of the refresh address control circuit 316 are shown to illustrate the operation of the refresh address control circuit 316. The dotted line around the refresh address control circuit 316, the row decoder 308, and the memory array 318 is shown to represent that in certain embodiments, each of the components within the dotted line may correspond to a particular bank of memory, and that these components may be repeated for each of the banks of memory. In some embodiments, the components shown within the dotted line may be associated with each of the memory banks. Thus, there may be multiple refresh address control circuits 316 and row decoders 308. For the sake of brevity, components for only a single bank will be described.

FIG. 3 shows an embodiment where the access logic 330 (e.g., sense amplifiers 140 and counter 142 of FIG. 1) of the counter memory mat 326 (e.g., 126 of FIG. 1) where manages updating a count value and provides a row hammer flag RHAFlag. Other embodiments of the invention may include providing the count value XCount outside the memory array 318 and adjusting it with a circuit in the refresh control circuit 316 (e.g., a counter circuit and threshold comparator).

A DRAM interface 340 may provide one or more signals to an address refresh control circuit 316 and row decoder 308 which in turn (along with a column decoder, not shown) may perform access operation on a memory array 318. The refresh address control circuit 316 may include an RHR state control 342, an aggressor address register 344, and a refresh address generator 350.

When a row of the memory array 318 is accessed, a mapping engine 332 (e.g., 218 of FIG. 2) of the row decoder 308 generates a counter address based on the received row address XADD. Based on the counter address, the row decoder 308 activates a row and set of bit lines in a counter memory mat 326 (e.g., 126 of FIGS. 1 and/or 202 of FIG. 2) to read a count value XCount from a set of memory cells in the counter mat 326 which store the value XCount. Access logic 330 of the counter memory mat 326 associated with those activated bit lines reads out the count value XCount, changes the count value (e.g., by incrementing it), writes the changed XCount back, and determines a state of a row hammer flag RHAFlag based on the updated count value.

If the value does not meet or exceed the threshold, then the access logic 330 may write the changed count back to the counter memory mat 326. If the value does meet or exceed the threshold, then the current address XADD may be determined to be an aggressor address. If the current address XADD is an aggressor address the flag RHAFlag is provided at the active level to the aggressor address register 344, which may record (e.g., latch) the current value of the row address XADD as an aggressor HitXADD. If the RHAFlag is at the active level, then the access logic may reset a value of the count by writing an initial value of the count (e.g., 0) back to the counter memory mat 326.

The RHR state controller 342 may provide the signal RHR to indicate that a targeted refresh operation, such as a row hammer refresh (e.g., a refresh of the victim rows corresponding to an identified aggressor row) should occur. The RHR state controller 342 may also provide an internal refresh signal IREF, to indicate that an auto-refresh operation should occur. Responsive to an activation of RHR, the aggressor address register 344 may provide an aggressor address HitXADD, and the refresh address generator 350 may provide a refresh address RXADD, which may be one or more victim addresses associated with HitXADD. Responsive to IREF, the refresh address generator 350 may provide an auto-refresh address as the refresh address RXADD. The row decoder 308 may perform a refresh operation responsive to the refresh address RXADD and the row hammer refresh signal RHR. The row decoder 308 may perform an auto-refresh operation based on the refresh address RXADD and the internal refresh signal IREF.

The DRAM interface 340 may represent one or more components which provides signals to components of the bank. In some embodiments, the DRAM interface 340 may represent a memory controller coupled to the semiconductor memory device (e.g., device 100 of FIG. 1). In some embodiments, the DRAM interface 340 may represent components such as the command address input circuit 102, the address decoder 104, and/or the command decoder 106 of FIG. 1. The DRAM interface 340 may provide a row address XADD, the auto-refresh signal AREF, an activation signal ACT, and a precharge signal Pre. The auto-refresh signal AREF may be a periodic signal which may indicate when an auto-refresh operation is to occur. The activation signal ACT may be provided to activate a given bank of the memory. The precharge signal Pre may be provided to precharge the given bank of the memory. The row address XADD may be a signal which specifies one or more particular wordlines of the memory array 318, and may be a signal including multiple bits (which may be transmitted in series or in parallel).

The aggressor address register 344 may store one or more row addresses which have been identified as aggressor addresses based on their access counts. Responsive to the row hammer flag RHAFlag at the active level, the aggressor address register 344 may store the current row address XADD which is being accessed. The aggressor address register 344 may provide the stored address as a match address HitXADD to the refresh address generator 350, which may calculate one or more victim addresses associated with the match address HitXADD. In some embodiments, the aggressor address register 344 may be a latch circuit which stores a single address. In some embodiments, the aggressor address register 344 may be a buffer which stores multiple addresses, and provides the first stored address as the match address HitXADD. The aggressor address register 344 may switch to a next address in the register after the victim row(s) associated with the first address have been refreshed.

The RHR state controller 342 may receive the auto-refresh signal AREF and provide the row hammer refresh signal RHR. The auto-refresh signal AREF may be periodically generated and may be used to control the timing of refresh operations. The memory device may carry out a sequence of auto-refresh operations in order to periodically refresh the rows of the memory device. The RHR signal may be generated in order to indicate that the device should refresh a particular targeted row (e.g., a victim row) instead of an address from the sequence of auto-refresh addresses. The RHR state controller 342 may use internal logic to provide the RHR signal. In some embodiments, the RHR state controller 342 may provide the RHR signal based on certain number of activations of AREF (e.g., every $4^{th}$ activation of AREF). The RHR state controller 342 may also provide an internal refresh signal IREF, which may indicate that an auto-refresh operation should take place. In some embodiments, the signals RHR and IREF may be generated such that they are not active at the same time (e.g., are not both at a high logic level at the same time).

The refresh address generator 350 may receive the row hammer refresh signal RHR and the match address HitXADD. The match address HitXADD may represent an aggressor row. The refresh address generator 350 may determine the locations of one or more victim rows based on the match address HitXADD and provide them as the refresh address RXADD. In some embodiments, the victim rows may include rows which are physically adjacent to the aggressor row (e.g., HitXADD+1 and HitXADD−1). In some embodiments, the victim rows may also include rows which are physically adjacent to the physically adjacent rows of the aggressor row (e.g., HitXADD+2 and HitXADD−2). Other relationships between victim rows and the identified aggressor rows may be used in other examples.

The refresh address generator 350 may determine the value of the refresh address RXADD based on the row hammer refresh signal RHR and the internal auto-refresh signal IREF. In some embodiments, when the signal IREF is active, the refresh address generator 350 may provide one of a sequence of auto refresh addresses. When the signal RHR is active, the refresh address generator 350 may provide a targeted refresh address, such as a victim address, as the refresh address RXADD.

The row decoder 308 may perform one or more operations on the memory array 318 based on the received signals and addresses. For example, responsive to the activation signal ACT and the row address XADD (and IREF and RHR being at a low logic level), the row decoder 308 may direct one or more access operations (for example, a read operation) on the specified row address XADD. Responsive to the RHR signal being active, the row decoder 308 may refresh the refresh address RXADD. In some embodiments, the counter 346 may increment the access count stored in the counter memory cells 326 responsive to a refresh operation of a given row. In some embodiments, the counter 346 may not increment the access count responsive to a refresh operation.

FIGS. 4-10 describe aspects of the disclosure related to a folded digit line architecture in the counter memory mats in more detail. FIGS. 11-14 describe aspects of the disclosure related to including counter logic within sense amplifier region associated with the counter memory mat in more detail. Some embodiments of the invention may use these different aspects separately (e.g., the folded architecture and counter logic may be used alone). Some embodiments may use these aspects together (e.g., the counter logic and folded architecture may be used together).

Figure 4:
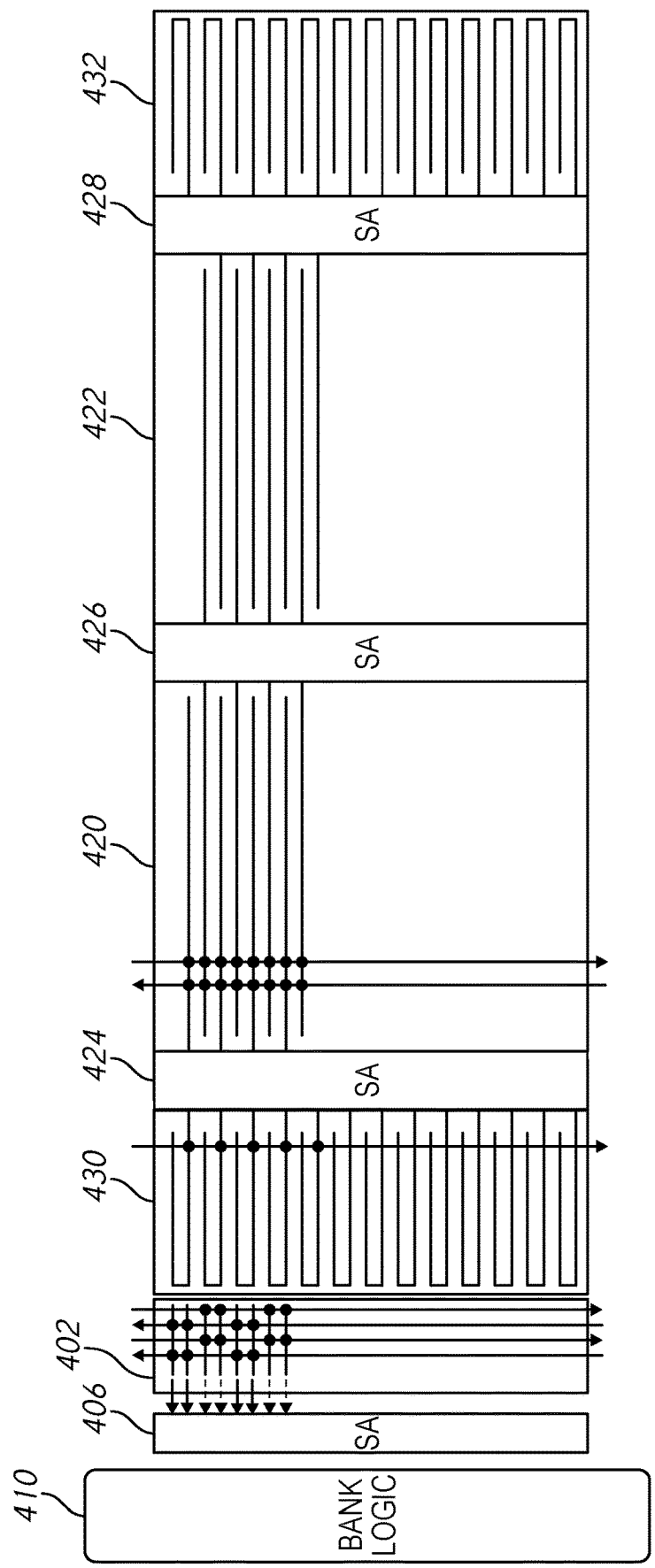
FIG. 4 is a block diagram of a memory with an even/odd architecture according to some embodiments of the present disclosure.

FIG. 4 is a block diagram of a memory with an even/odd architecture according to some embodiments of the present disclosure. The memory 400 may, in some embodiments, be an implementation of the array 118 and/or memory 200 of FIG. 2. The memory 400 may be similar to the array discussed with respect to the memory 200 of FIG. 2, except that the memory 400 shows an implementation of the folded architecture of the counter mat 402. For the sake of brevity, features and operations analogous to those previously discussed with respect to FIGS. 1-3 may not be repeated again with respect to FIG. 4. The memory 400 shows a single bank of a memory array and its associated logic.

The memory 400 includes bank logic 410. The bank logic 410 (e.g., 210 of FIG. 2). The bank logic 410 includes various circuits, such as row decoders (e.g., 108 of FIG. 1) and refresh control circuits (e.g., 116 of FIG. 1) which manage operations of the bank. For example, local input/output lines (not shown) may couple data between the bank logic 410 and the various sense amplifier regions and mats.

Similarly, the bank logic 410 may provide control signals (not shown) to operate the mats and sense amplifier regions.

The memory 400 shows two example normal mats 420 and 422 (e.g., 130 of FIGS. 1 and/or 220 of FIG. 2). The normal mats 420 and 422 include memory cells at the intersection of each word line and bit line. Some example memory cells, shown as dots, are depicted in FIG. 4, however not all memory cells are depicted in FIG. 4. For the sake of illustration, only two normal mats are shown, however in other embodiments there may be more or fewer memory mats. For example, there may be 42 normal memory mats such as the mats 420 and 422. The normal mats 420 and 422 are separated from each other by a sense amplifier region 426 (e.g., 224 of FIG. 2). There are additional sense amplifier regions 424 and 428 at the edge of mats 420 and 422 respectively. Each sense amplifier region 424-428 includes a number of sense amplifiers, each of which are coupled to one or more bit lines in the adjacent normal mats 420 and 422. For example, a region which is between two normal mats, such as 426, have sense amplifiers which are coupled to a bit line in each of the adjacent normal mats 420 and 422. Each normal mat may alternate which adjacent sense amplifier region the bit lines are coupled to. For example, in mat 420, a first bit line is coupled to region 424, a second bit line is coupled to region 426, a third bit line is coupled to region 424, etc.

Since the normal mats use an open ended architecture, and since sense amplifiers have two inputs, the sense amplifiers at an edge of the normal mats, such as sense amplifier regions 424 and 428, may be coupled to an edge region, such as 430 and 432 respectively. The sense amplifier region 424 has amplifiers coupled to a bit line in normal mat 420 and coupled to the edge region. The sense amplifier region 428 has amplifiers coupled to a bit line in a normal mat 422 and coupled to the edge region 432. The edge regions store less data than the normal mats 430, and may be used to provide a reference voltage to the sense amplifiers coupled to the adjacent normal mats. For example, the edge region 430 has memory cells at every other intersection of a word line and bit line, with each bit line being folded over so that every pair bit lines are coupled together.

The memory 400 also includes a counter mat 402 and its associated sense amplifier region 402. The counter mat 402 uses a folded bit line architecture, and so there may be only a single sense amplifier region 406 (e.g., rather than one sense amplifier region on each side). The counter mat 402 stores a number of a count values, each of which is associated with a number of accesses to a word line in one of the normal mats 420 or 422. The bank logic 410 may include a refresh control circuit which may determine if one or more of the rows in the normal mats 420 or 422 is an aggressor based on the counts stored in the counter mat 402.

The counter mat 402 may be positioned proximal to the bank logic 410. For example, the counter mat 402 may be positioned between the normal mats 420 and 422 and the bank logic 410, with the sense amplifier region 406 positioned between the counter mat 402 and the bank logic 410.

In the counter mat 402, each pair of even and each pair of odd digit lines are coupled to a respective same sense amplifier in the sense amplifier region 204. For example, bit lines BL0 and BL2 are coupled to a first even sense amplifier, bit lines BL1 and BL3 are coupled to a first odd sense amplifier, etc. Along a given word line each pair of bit sense amplifier is coupled to one memory cell. For example, considering a word line WL0, bit lines BL0 and BL1 are each coupled to a word line at their intersection with WL0, while bit lines BL2 and BL3 are not coupled to a memory cell at the intersection of WL0.

Any given bit line may alternate at which word lines it is coupled to a memory cell. For example, bit lines BL0 and BL1 are each coupled to memory cells along even word lines (WL0, WL2, etc.) while bit lines BL2 and BL3 are each coupled to memory cells along odd word lines (WL1, WL3, etc.). Similarly, considering moving along a word line, the word line may have a pattern of two memory cells, two non-memory cells, etc. Accordingly, the counter mat 402 may have half has many memory cells as it has wordlines times bitlines. In some embodiments, the memory cell at the intersections where no memory cell is coupled may be omitted entirely (e.g., no physical components present). In some embodiments, the memory cells may be present, but not coupled to the word line and/or bit line. In FIG. 4, memory cells are indicated as a circle placed on the intersection of a bit line (horizontal) and word line (vertical), while intersections without a dot indicate there is not a coupled memory cell.

The paired bit lines may connect to different rows of sense amplifiers in the sense amplifier region 406. For example, there may be an even row of sense amplifiers and an odd row of sense amplifiers. The layout of the sense amplifier region and sense amplifiers is discussed in more detail in FIGS. 5-7.

Figure 5:
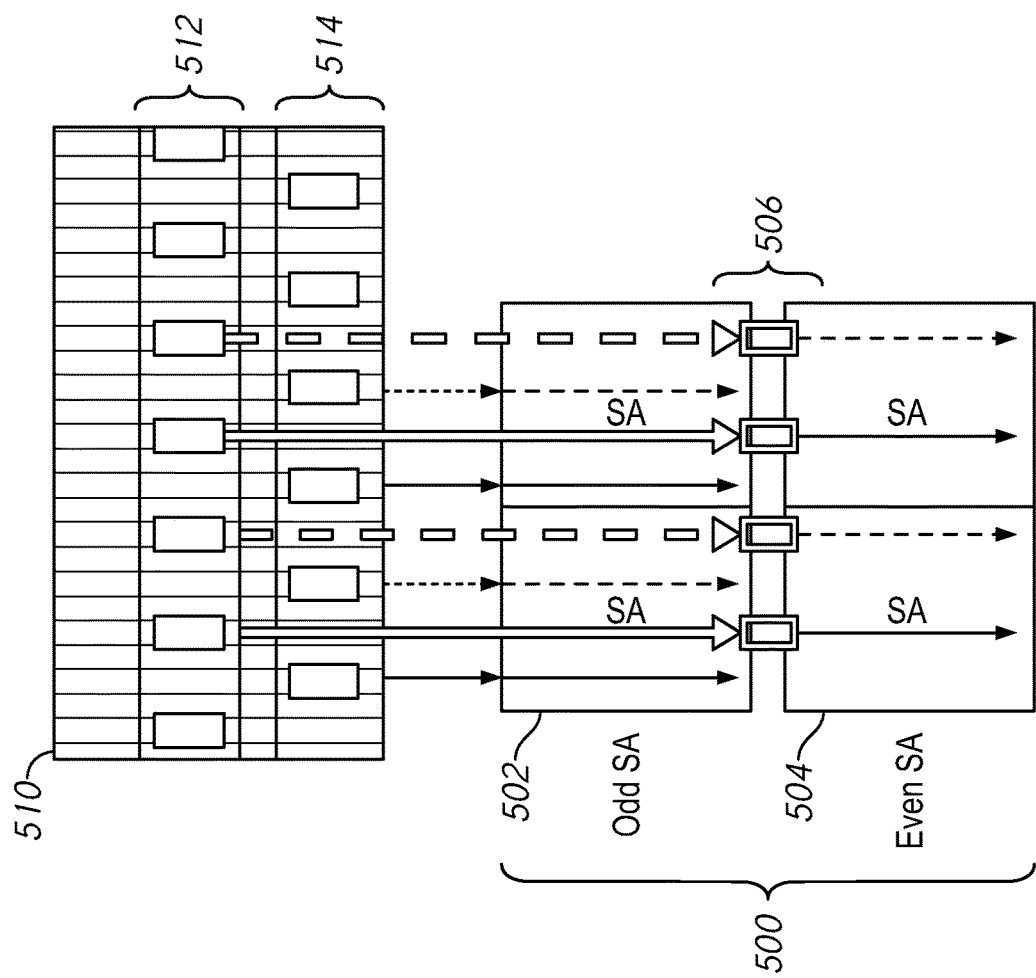
FIG. 5 is a block diagram of a sense amplifier region according to some embodiments of the present disclosure.

FIG. 5 is a block diagram of a sense amplifier region according to some embodiments of the present disclosure. The sense amplifier region 500 may be an implementation of the sense amplifier region 406 of FIG. 4 in some embodiments. The memory mat 510 may be an implementation of counter mat 402 of FIG. 4 in some embodiments.

The sense amplifier region 500 is divided into an even sense amplifier region 504 and odd sense amplifier region 502, which are coupled to pairs of even and odd bit lines respectively. Since the even sense amplifiers 504 are 'behind' the odd sense amplifiers 502 from the perspective of the mat 510, it may be necessary for the even digit lines to cross over the odd sense amplifier region 502.

The odd digit lines have a row of contacts 514 which couple the digit line to conductive elements in a first metal layer (e.g., an M0) layer which then couples to the odd sense amplifiers 502. The even digit lines have a row of contacts 514 which couple the digit lines to though silicon vias (TSVs) to a different metal layer (e.g., an Li1/Li2 layer) which then passes over the odd sense amplifier region 502. A second row of contacts 506 between the odd and even SA regions couples the conductive elements to another set of TSVs which then couples the even digit lines to the even sense amplifiers 504.

While the odd sense amplifiers 502 are shown in front of the even sense amplifiers 504, in other embodiments this may be reversed, and it may be the odd digit lines which need to cross over a line of even sense amplifiers. For consistency, even digit lines will generally be referred to as the ones that need to cross a line of sense amplifiers.

Figure 6:
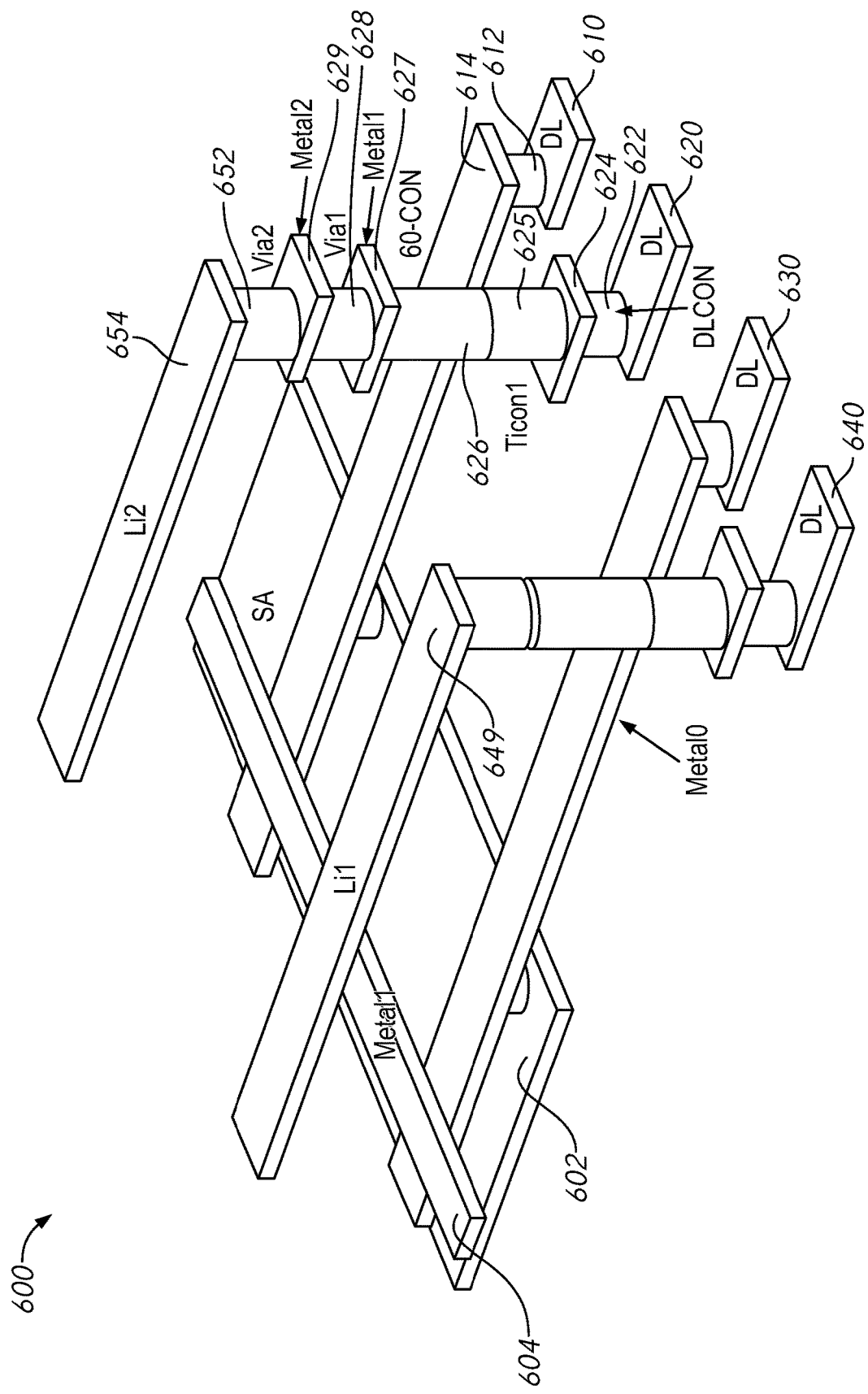
FIG. 6 is a perspective view of sense amplifier couplings according to some embodiments of the current disclosure.

FIG. 6 is a perspective view of sense amplifier couplings according to some embodiments of the current disclosure. The sense amplifier couplings 600 may, in some embodiments, be used to couple digit lines to even and odd rows of sense amplifiers in an implementation of the memories 400 of FIG. 4 and/or FIG. 5.

FIG. 6 shows four example digit lines 610, 620, 630, and 640. Digit lines 610 and 630 are odd digit lines, and digit lines 620 and 640 are even digit lines. Accordingly, the digit lines 610 and 630 need to pass over an even sense amplifier region 602.

The digit line 610 is coupled to a digit line conductor 612, which couples to a conductive element in base metal layer 614 The conductive element then couples to couplings 604 in a first metal layer metal1 which couples the conductive element to a sense amplifier in the region 602. The digit line 630 is coupled to the sense amplifier region 602 in an analogous manner.

The digit line 620 is coupled by a digit line conductor 622 up through a first metal layer 624 to a first conductive layer 625 (e.g., lithium conductive layer licon1), which in turn is coupled to a second conductive layer 626 (e.g., 60-CON), which connects to a first metal layers metal1 627. The first metal layer 627 is coupled through a first TSV 628 (via1) to a second metal layer 629 (e.g., metal2) and through a second TSV 652 to a second conductive layer 654 (e.g., Li2). The second conductive layer 654 passes over the sense amplifier region 602 (and couplings 604) to a second sense amplifier region (not shown), where a structure similar to elements 622-629 and 652-654 may be used to couple the signal in the second conductive layer 654 back "down" to the second sense amplifier region.

The digit line 640 may be coupled in a similar fashion to the digit line 620, except that the digit line 640 is coupled to a conductive element in a second metal layer 649 (which may be the same layer as 629).

Figure 7:
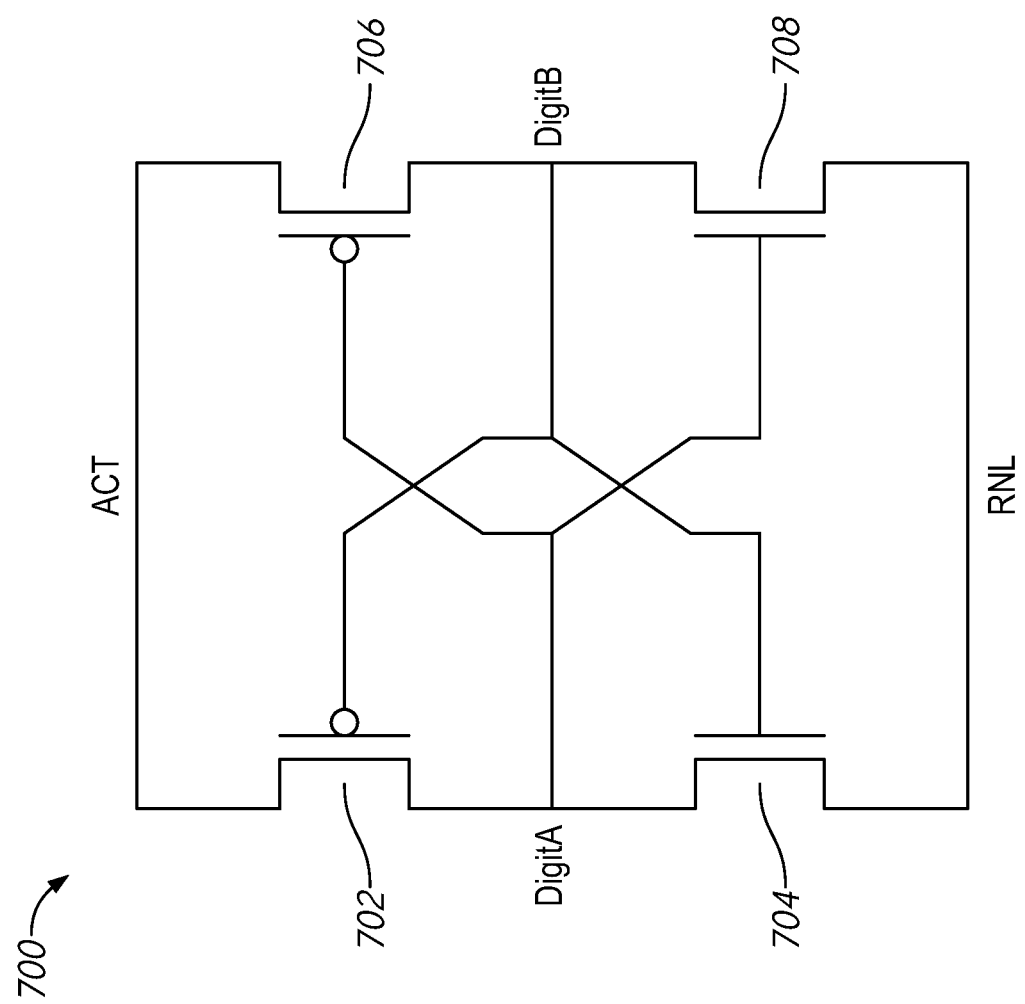
FIG. 7 is a schematic diagram of a sense amplifier according to some embodiments of the present disclosure.

FIG. 7 is a schematic diagram of a sense amplifier according to some embodiments of the present disclosure. The sense amplifier 700 may implement one of the sense amplifiers in the sense amplifier regions 406 of FIGS. 4 and/or 500 of FIG. 5.

The sense amplifier 700 may include a pair of cross coupled inverters, each of which is coupled to one digit line as an input and the other digit line as an output. The inverters are coupled between a first system voltage, such as an activation signal ACT, which represents a high logical level, and a second system voltage, such as RNL, which represents a low logical level.

The sense amplifier 700 includes a first transistor 702 with a source coupled to ACT and a drain coupled to a node digitA coupled to a first digit line and a gate coupled to a node digitB coupled to the second digit line. The amplifier 700 also includes a second transistor 704 with a source coupled to a RNL, a drain coupled to digitA and a gate coupled to digitB. The first amplifier may be p-type while the second amplifier may be n-type. The amplifier 700 includes a third transistor 706 with a source coupled to ACT, a drain coupled to digitB, and a gate coupled to digitA and a fourth transistor 708 with a source coupled to RNL, a drain coupled to digitB, and a gate coupled to digitA.

The first digit line node digitA may be coupled to a digit line which intersects a memory cell along an active word line, while the second digit line node digitB may be coupled to a digit line which does not intersect a memory cell along the active word line. If the signal on digitA is high (e.g., representing a logical high), then transistor 708 is active which couples RNL to digitB, which in turn activates transistor 702 coupling ACT to digitA. Similarly, if the signal on digitA is low (e.g., a logical low), then the transistor 706 may activate, coupling digitB to ACT, which in turn may activate 704, coupling digitA to RNL. The value on digitA may be latched (or on digitB and inverted) to represent the logical level of the signal read out along the digit line coupled to digitA.

Figure 8:
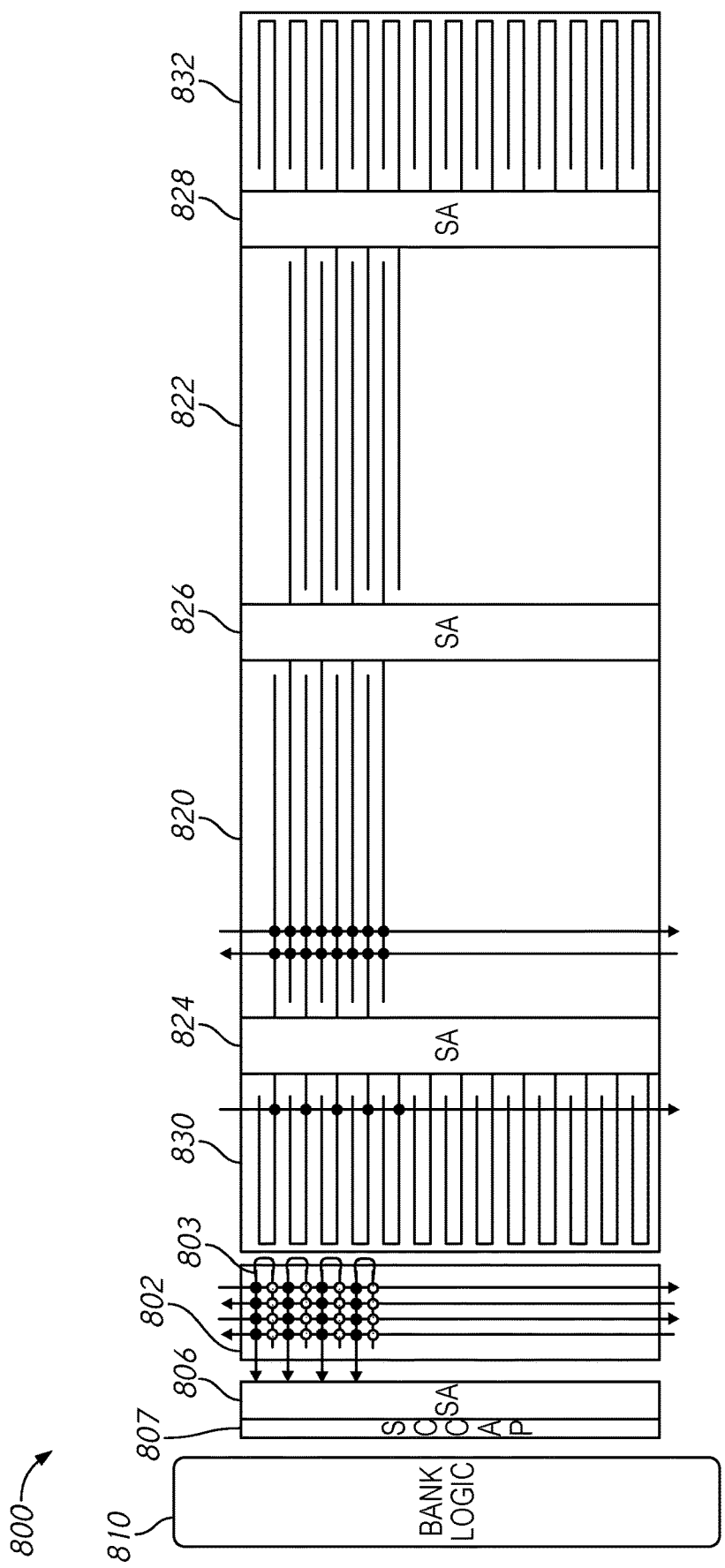
FIG. 8 is a block diagram of a block diagram of a memory with a doubled bit line architecture according to some embodiments of the present disclosure.

FIG. 8 is a block diagram of a block diagram of a memory with a doubled bit line architecture according to some embodiments of the present disclosure. The memory 800 may, in some embodiments, be an implementation of the array 118 and/or memory 200 of FIG. 2. The memory 800 may be similar to the array discussed with respect to the memory 200 of FIG. 2, except that the memory 800 shows an implementation of the folded architecture of the counter mat 802. For the sake of brevity, features and operations analogous to those previously discussed with respect to FIGS. 1-3 may not be repeated again with respect to FIG. 8.

In the memory 800, the counter mat 802 includes architecture that couples adjacent bit lines together. The two bit lines are then both coupled to a same input of a sense amplifier in the sense amplifier region 806. The other input of each sense amplifier is coupled through a reference capacitor in a capacitor region 807 to a system voltage (e.g., a ground voltage).

The memory 800 includes bank logic 810. The bank logic 810 (e.g., 210 of FIG. 2). The bank logic 810 includes various circuits, such as row decoders (e.g., 108 of FIG. 1) and refresh control circuits (e.g., 116 of FIG. 1) which manage operations of the bank. For example, local input/output lines (not shown) may couple data between the bank logic 810 and the various sense amplifier regions and mats. Similarly, the bank logic 810 may provide control signals (not shown) to operate the mats and sense amplifier regions.

The memory 800 shows two example normal mats 820 and 822 (e.g., 130 of FIGS. 1 and/or 220 of FIG. 2). For the sake of illustration, only two normal mats are shown, however in other embodiments there may be more or fewer memory mats. For example, there may be 42 normal memory mats such as the mats 820 and 822. The normal mats 820 and 822 are separated from each other by a sense amplifier region 826 (e.g., 224 of FIG. 2). There are additional sense amplifier regions 824 and 828 at the edge of mats 820 and 822 respectively. Each sense amplifier region 824-828 includes a number of sense amplifiers, each of which are coupled to one or more bit lines in the adjacent normal mats 820 and 822. For example, a region which is between two normal mats, such as 826, have sense amplifiers which are coupled to a bit line in each of the adjacent normal mats 820 and 822. Each normal mat may alternate which adjacent sense amplifier region the bit lines are coupled to. For example, in mat 820, a first bit line is coupled to region 824, a second bit line is coupled to region 826, a third bit line is coupled to region 824, etc.

Since the normal mats use an open ended architecture, and since sense amplifiers have two inputs, the sense amplifiers at an edge of the normal mats, such as sense amplifier regions 824 and 828, may be coupled to an edge region, such as 830 and 832 respectively. The sense amplifier region 824 has amplifiers coupled to a bit line in normal mat 820 and coupled to the edge region. The sense amplifier region 828 has amplifiers coupled to a bit line in a normal mat 822 and coupled to the edge region 832. The edge regions do not store data, but may be used to provide a reference voltage to the sense amplifiers.

The memory 800 also includes a counter mat 802 and its associated sense amplifier region 802. The counter mat 802 uses a folded bit line architecture, and so there may be only a single sense amplifier region 806 (e.g., rather than one sense amplifier region on each side). The counter mat 802 stores a number of a count values, each of which is associated with a number of accesses to a word line in one of the normal mats 820 or 822. The bank logic 810 may include a refresh control circuit which may determine if one or more of the rows in the normal mats 820 or 822 is an aggressor based on the counts stored in the counter mat 802.

The counter mat 802 may be positioned proximal to the bank logic 810. For example, the counter mat 802 may be positioned between the normal mats 820 and 822 and the bank logic 810, with the sense amplifier region 806 and capacitor region 807 positioned between the counter mat 802 and the bank logic 810.

The counter mat 802 includes a doubled bit line architecture in which two digit lines, each intersecting a memory cell along an activated word line, are coupled to an input of the sense amplifier. For example, connectors 803 may be used to short pairs of adjacent bit lines to each other. The sense amplifiers in the sense amplifier region 807 may then be coupled to every other bit line. Accordingly, although each sense amplifier is directly coupled to one bit line, it is coupled to another adjacent bit line via the connector 803. Accordingly during an access operation, two memory cells may both contribute to the signal on the bit line which is coupled to one input of the sense amplifier. The other input is coupled to a reference voltage through a capacitor in a capacitor region 807. The capacitor may match a capacitance of the bit lines.

Figure 9:
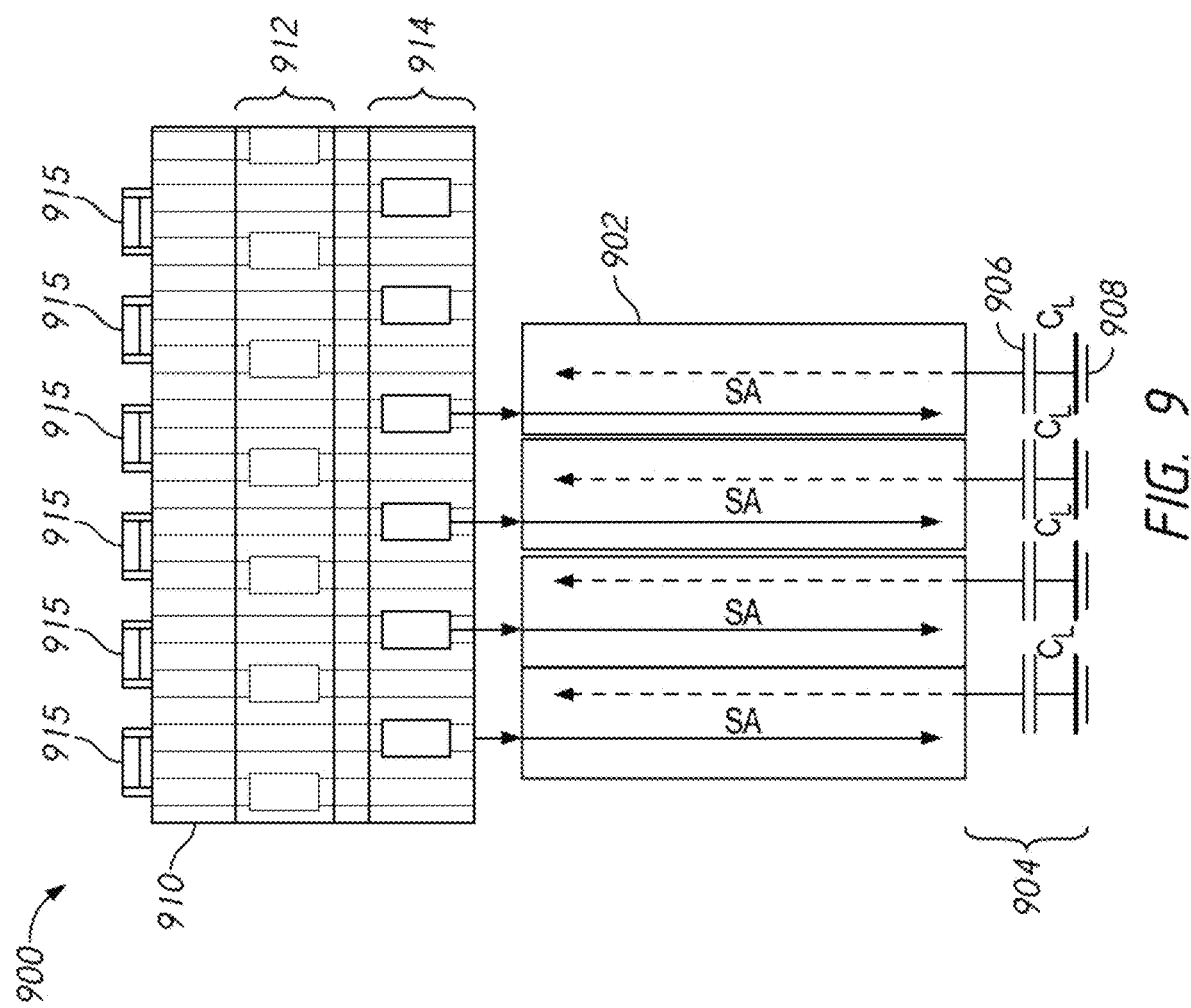
FIG. 9 is a block diagram of a sense amplifier region according to some embodiments of the present disclosure.
Figure 10:
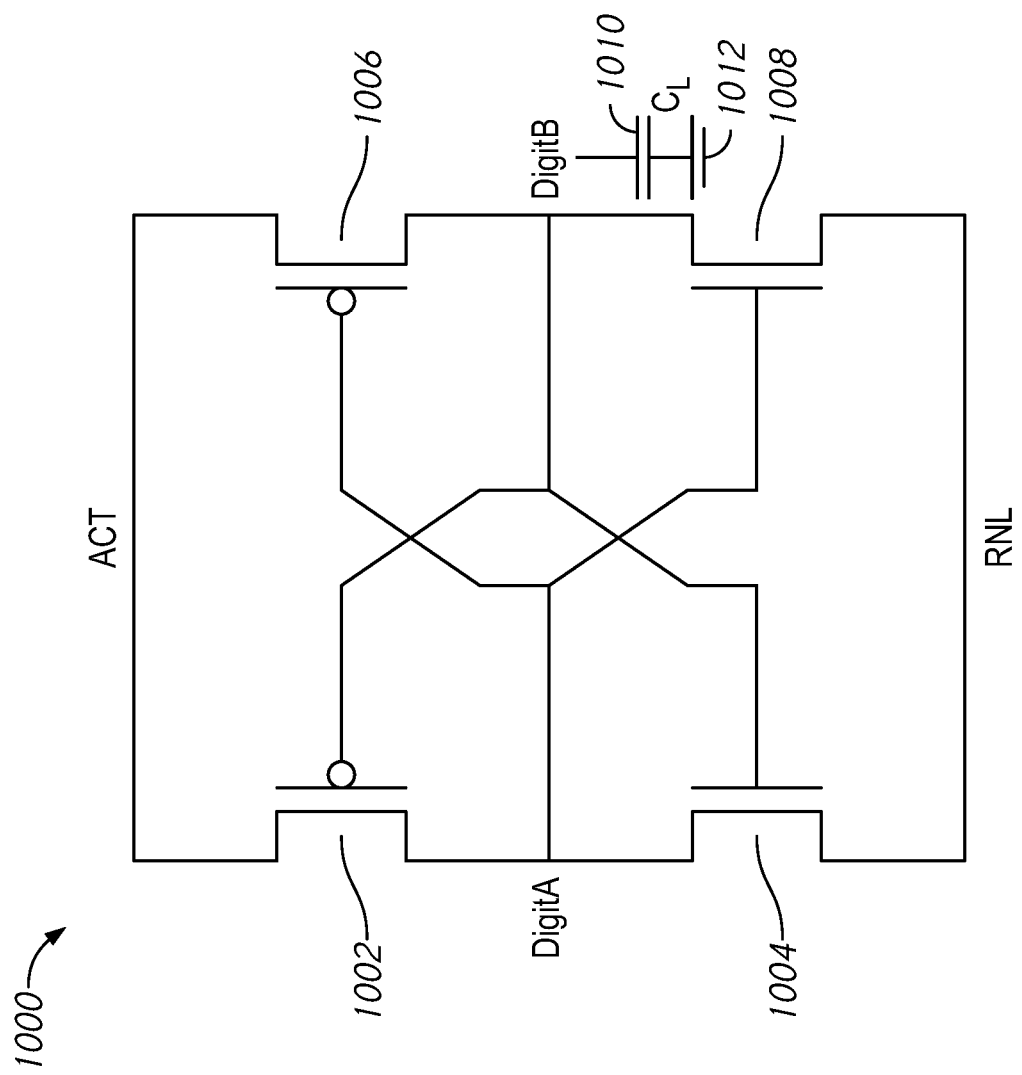
FIG. 10 is a schematic diagram of a sense amplifier according to some embodiments of the present disclosure.

The layout of the sense amplifier region and sense amplifiers is discussed in more detail in FIGS. 9-10.

FIG. 9 is a block diagram of a sense amplifier region according to some embodiments of the present disclosure. The sense amplifier region 900 may be an implementation of the sense amplifier region 806 of FIG. 4 in some embodiments. The memory mat 910 may be an implementation of counter mat 802 of FIG. 8 in some embodiments. The capacitor region 904 may be an implementation of the capacitor region 803 of FIG. 8 in some embodiments.

In the memory mat 910, every other digit line is coupled to a sense amplifier of the sense amplifier region. For example, connector region 912 includes no connectors, while connector region 914 couples the even digit lines to the sense amplifiers of the sense amplifier region 900. Accordingly, only the even digit lines are coupled directly to the sense amplifier region 900. However, each even digit line is also coupled to one odd digit line via a connector 915. For example, adjacent pairs of digit lines may be coupled together. Accordingly, during a read operation, the signal line that couples the connector 914 to the sense amplifier carries a voltage based on the charge of two memory cells.

Each sense amplifier, such as 902, of the sense amplifier region 900, has a first input coupled to a bit line (and through connector 915 to a second bit line) and a second input coupled to the capacitor region 904. For example, each sense amplifier may have a second input coupled through a capacitor 906 to a system voltage 908 which may act as a reference voltage for sensing operations.

FIG. 10 is a schematic diagram of a sense amplifier according to some embodiments of the present disclosure. The sense amplifier 1000 may implement one of the sense amplifiers in the sense amplifier regions 806 of FIGS. 8 and/or 900 of FIG. 9.

The sense amplifier 1000 may include a pair of cross coupled inverters, each of which is coupled to one digit line as an input and the other digit line as an output. The inverters are coupled between a first system voltage, such as an activation signal ACT, which represents a high logical level, and a second system voltage, such as RNL, which represents a low logical level.

The sense amplifier 1000 includes a first transistor 1002 with a source coupled to ACT and a drain coupled to a node digitA coupled to a first digit line and a gate coupled to a node digitB which is coupled through a capacitor 1010 and through that to a system voltage 1012. The system voltage may be a reference voltage, for example a voltage which is equal to the voltage on ACT, equal to the voltage on RNL, or halfway in between. Other reference voltages may be used in other example embodiments. The amplifier 1000 also includes a second transistor 1004 with a source coupled to a RNL, a drain coupled to digitA and a gate coupled to digitB. The first amplifier may be p-type while the second amplifier may be n-type. The amplifier 1000 includes a third transistor 1006 with a source coupled to ACT, a drain coupled to digitB, and a gate coupled to digitA and a fourth transistor 1008 with a source coupled to RNL, a drain coupled to digitB, and a gate coupled to digitA.

The first digit line node digitA may be coupled to a digit line which intersects a memory cell along an active word line and is coupled to a second digit line which also intersects a memory cell along the active word line. Accordingly, the voltage on digitA may be initially driven by the charge on two memory cells. If the signal on digitA is high (e.g., representing a logical high), then transistor 1008 is active which couples RNL to digitB, which in turn activates transistor 1002 coupling ACT to digitA. Similarly, if the signal on digitA is low (e.g., a logical low), then the transistor 1006 may activate, coupling digitB to ACT, which in turn may activate 1004, coupling digitA to RNL. The value on digitA may be latched (or on digitB and inverted) to represent the logical level of the signal read out along the digit line coupled to digitA.

The capacitance CL of the capacitor 1010 may mimic a capacitance of the bit lines coupled to digitA. For example, in some embodiments, the capacitance CL may match the capacitance of the two digit lines. In some embodiments, the capacitance CL may be within a tolerance of the capacitance of the two digit lines.

Figure 11:
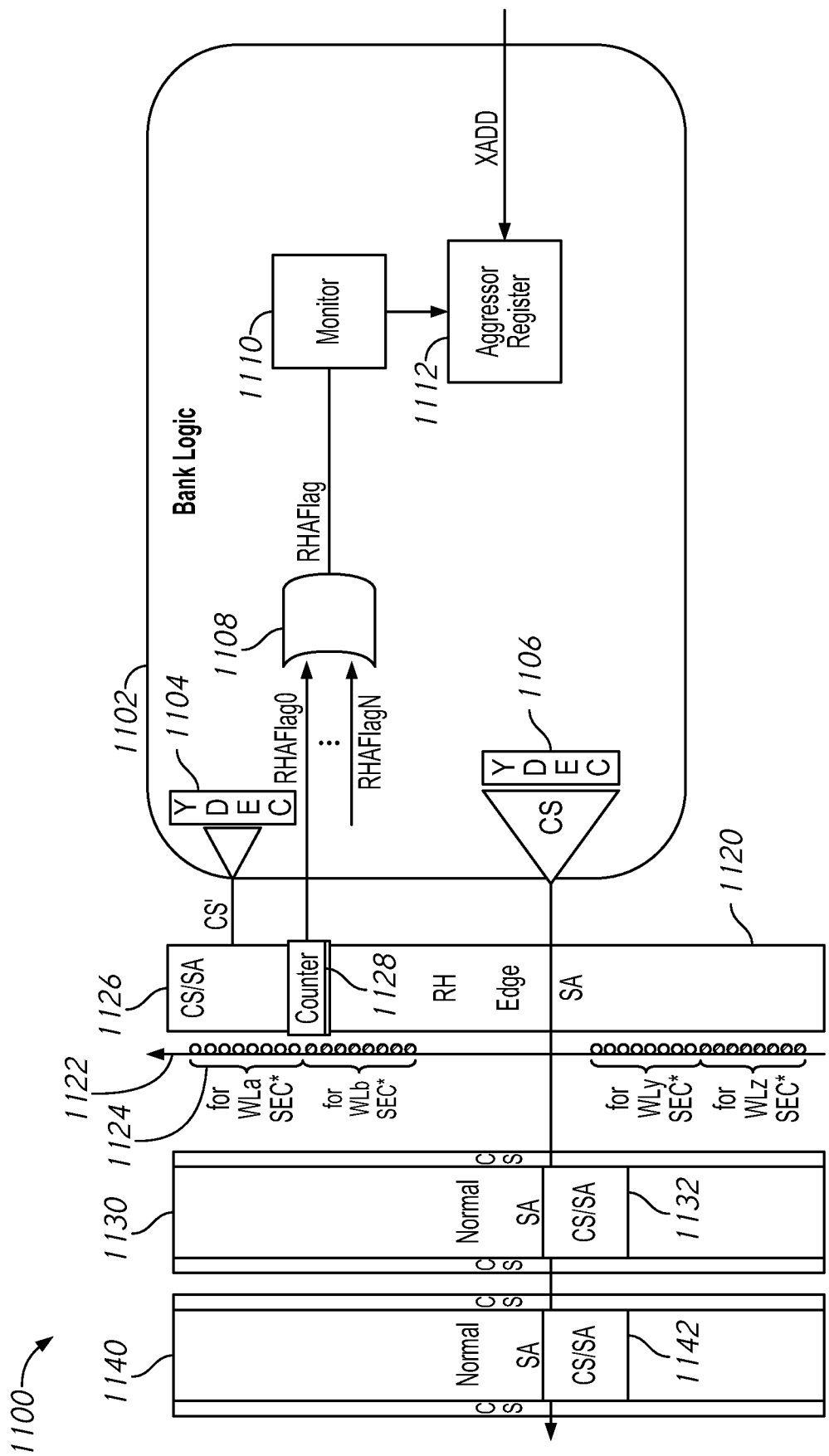
FIG. 11 is a block diagram of row hammer detection logic according to some embodiments of the present disclosure.
Figure 12:
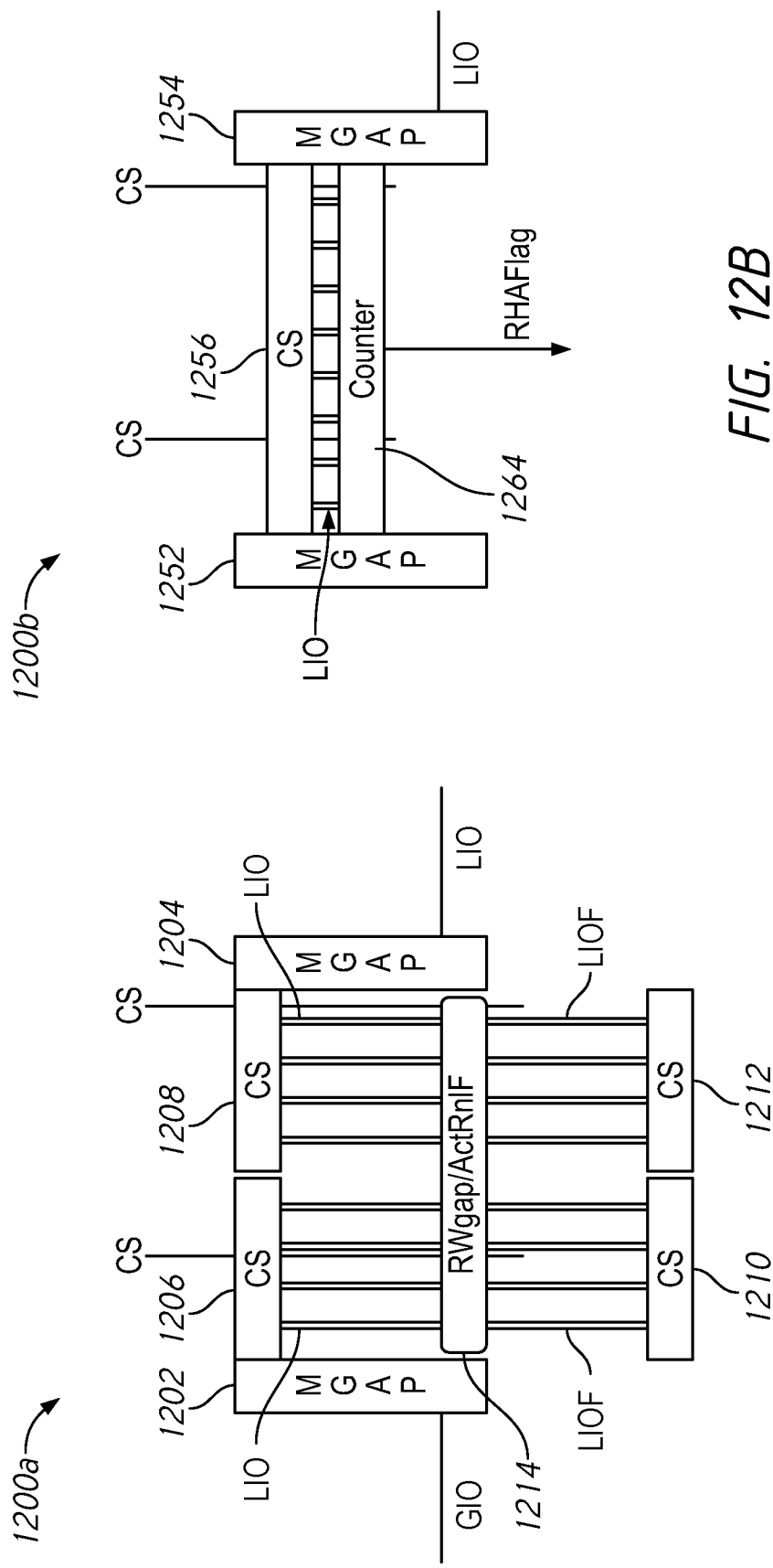
FIGS. 12A and 12B are cross sections of access logic according to some embodiments of the present disclosure.

FIG. 11 is a block diagram of row hammer detection logic according to some embodiments of the present disclosure. The row hammer detection logic 1100 may, in some embodiments, be included in a memory device such as 100 of FIGS. 1 and/or 200 of FIG. 2. The row hammer detection logic 1100 includes bank logic (e.g., 210 of FIG. 2), a counter mat sense amplifier region 1120 (e.g., 204 of FIG. 2) and two normal mat sense amplifier regions 1130 and 1140 (e.g., 222 and 224 of FIG. 2). The memory mats have been omitted, except for an example word line 1122 in the counter memory mat.

The normal sense amplifier regions 1130 and 1140 each include column access circuits (CS/SA) 1132 and 1142. The column access circuits 1132 and 1142 each include various contacts which receive a column select signal CS from a column decoder 1106 of the bank logic 1102. Responsive to a signal CS associated with the column access circuit 1132 and/or 1142 being active, a set of bit lines coupled to the column access circuits are coupled to respective sense amplifiers via LIO lines, and then read or written along GIO lines. For example during a read operation in which a word line in a mat associated with sense amplifier region 1130 is active, the column decoder 1106 provides a CS signal which activates the column access circuit 1132. A set of bit lines associated with the access circuit 1132 are activated, and memory cells at the intersection of those bit lines and the active word line are coupled to a set of sense amplifiers along the LIO lines. The sense amplifiers amplify the signal on those bit lines and provide the amplified data along GIO lines.

The counter mat SA region 1120 includes access logic 1126 which also includes a counter circuit 1128. Responsive to receiving a row address as part of an access operation, a mapping engine (not shown) of the bank logic 1102 generates a counter address CADD which specifies a word line and column select signal CS' in the counter mat. For example, the word line 1122 may be activated. The word line 1122 has multiple sets of bit lines, such as bit lines 1124, each of which is associated with a count value for a different row address. For example, a first row address WLa is associated with bit lines 1124. Each set of bit lines is associated with a respective set of column access circuits and is activated by a different column select signal CS'.

When a column decoder 1104 provides a column select signal CS' associated with the column access circuits 1126, the bit lines 1124 are activated and data (e.g., the bits of XCount) is read out along the LIO lines to sense amplifiers. The sense amplifiers amplify the values, and then provide XCount to the counter 1128. The counter changes the value XCount (e.g., by incrementing). If the updated value XCount is below a threshold (e.g., a most significant bit of XCount is inactive), then the updated value of XCount is written back along the LIO lines to the bit lines 1124 (and memory cells at the intersection with word line 1122). If the updated value XCount meets or exceeds the threshold (e.g., a most significant bit of XCount is active), then a flag signal RHAFlag0 associated with the access logic 1126 is provided at an active level and the value of XCount is reset (e.g., to 0) before being written back along the LIO lines to the bit lines 1124. The flag signal RHAFlag0 may be provided along GIO lines to the bank logic 1102. In this way, the count XCount may remain within the counter memory mat and its associated sense amplifier region 1126, while the flag value RHAFlag0 is reported out along GIO lines to a bank logic 1102.

The bank logic 1102 includes an OR gate 1108, which receives the different aggressor flags RHAFlag0 to RHAFlagN. Each of the aggressor flags is provided by one of the access logic circuits such as 1126 in the counter mat sense amplifier area 1120. In other words, each of the different aggressor flags RHAFlag0 to RHAFlagN has a state which reflects whether one of the count values XCount has met or exceeded a threshold. The OR gate 1108 provides an overall RHAFlag which is active if any of the individual flags RHAFlag0 to RHAFlagN are active. In other words, when any one XCount values meets or exceeds the threshold, the flag RHAFlag becomes active. A monitor circuit 1110 may determine when the flag RHAFlag becomes active, and signal the aggressor register 1112 (e.g., 344 of FIG. 3) that the current address XADD should be stored.

The signal line that the column decoder 1106 uses to provide the signal CS to the access logic 1132 and 1142 may be longer than the signal line that the column decoder 1104 uses to provide the signal CS' to the access logic 1126 in the counter mat sense amplifier region 1120. The signal line of the signal CS may be in a first metal layer and the signal line of the signal CS' may be in a second, different, metal layer.

FIGS. 12A and 12B are cross sections of access logic according to some embodiments of the present disclosure. The access logic 1200a of FIG. 12A represents an example implementation of access logic, such as 1132 and 1142 of FIG. 11, which may be used in a sense amplifier region associated with a normal memory mat (e.g., 130 or 132 of FIG. 1). The access logic 1200b of FIG. 12B represents an example implementation of access logic, such as 1126, associated with a counter memory mat (e.g., 126 of FIG. 1). The access logic circuits 1200a and 1200b show signal lines and contacts used to conduct signals and activate bit lines. For clarity of illustration, the sense amplifiers have been omitted from the view of FIGS. 12A-12B.

The access logic 1200a includes a set of bit lines coupled to LIO lines, and a set of bit lines which act as references coupled to LIO lines here labelled LIOF. The LIO lines may couple to bit lines in a first memory mat, and the lines LIOF couple to bit lines in a second memory mat. The LIO and LIOF lines are activated by CS contacts 1206, 1208, 1210, and 1212. The bit lines and contacts may be positioned between metal gap regions 1202 and 1204. Each of the CS contacts 1206, 1208, 1210, and 1212 is coupled to four bit lines. Two paired sets of CS contacts are activated by a CS signal. For example, 1206 and 1210 share a CS signal, and 1208 and 1212 share a CS signal. The sense amplifiers (not shown) may generally be located between the CS contacts. For example, there may be four sense amplifiers, each with one input coupled to an LIO coupled to CS contact 1206 and one input coupled to an LIO coupled to CS contact 1210, and four sense amplifiers similarly coupled between contacts 1208 and 1212. A read/write gap 1214 region includes contacts which couple the bit lines to GIO lines. Accordingly, in the embodiment of FIGS. 12A, when the two CS signals are active, eight total bits are read out.

The access logic 1200b includes a set of bit lines coupled to LIO lines and positioned between metal gaps 1254 and 1254. The set of bit lines extend into a counter memory mat. Since the access logic 1200b uses a folded architecture, the sense amplifiers coupled between the LIOs and Counter logic (not shown) are coupled to bit lines which extend into a single memory mat. Similarly, only a single CS contact 1256 is used, which activates all eight of the coupled LIOs/bit lines. Rather than being directly coupled to GIO through a RWgap, such as 1214 of FIG. 12A, in the access logic 1200b, the LIOs are coupled to a counter circuit 1264. The counter circuit receives the bits of a count value XCount from the active bit lines, adjusts the value, activates a flag signal Flag (and also resets the value) if the adjusted value is greater or equal to a threshold, and writes the adjusted value back. The flag signal RHAFlag is provided to bank logic. If the flag signal RHAFlag is active, the value XCount is reset (e.g., to an initial value such as 0) before being written back.

Figure 13:
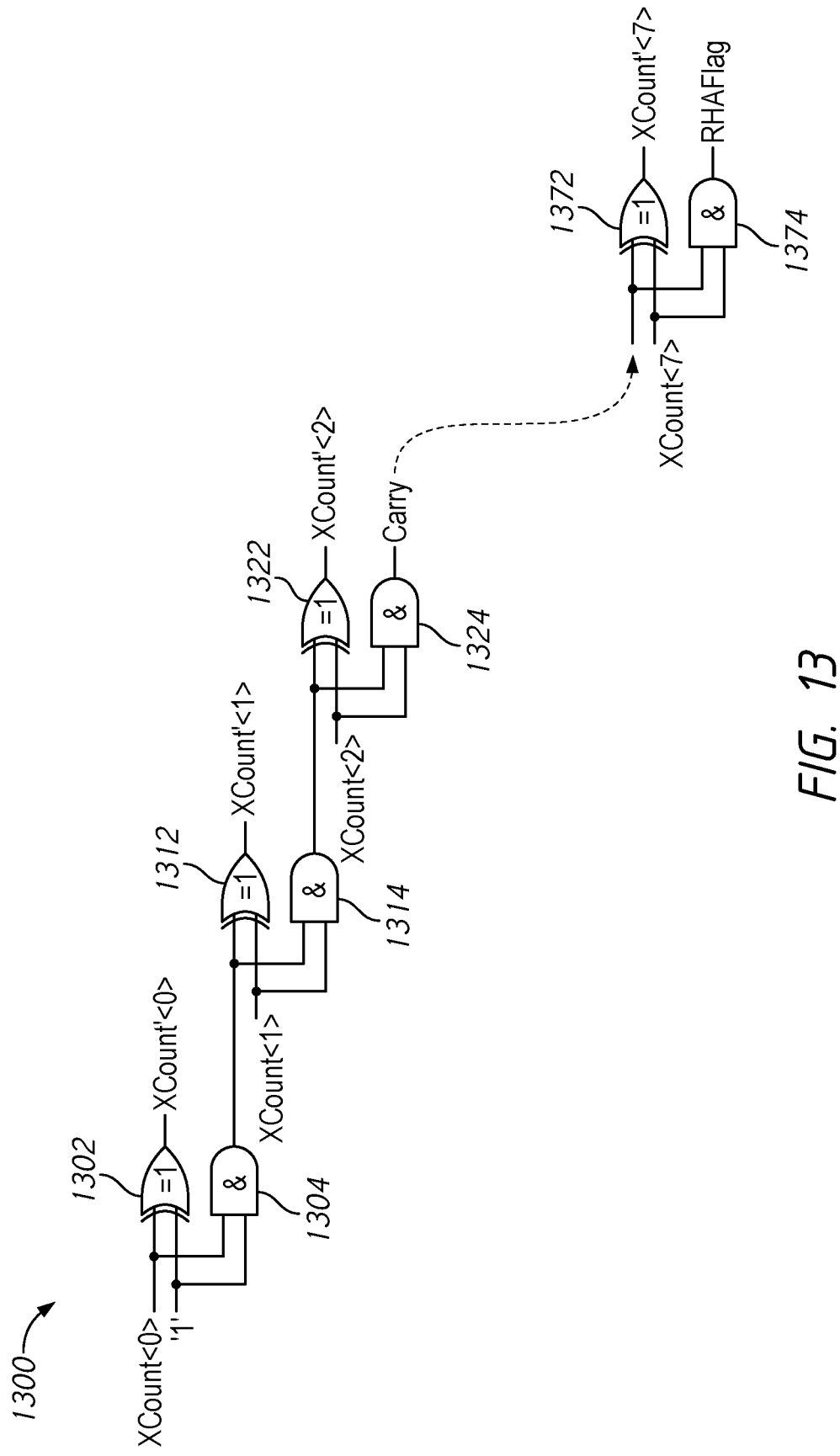
FIG. 13 is a schematic diagram of a counter according to some embodiments of the present disclosure.

FIG. 13 is a schematic diagram of a counter according to some embodiments of the present disclosure. The counter 1300 may, in some embodiments, be an implementation of the counter 142 of FIG. 1, 207 of FIG. 2, 1128 of FIG. 11, and/or 1264 of FIG. 12. The counter 1300 of FIG. 13 is an 8-bit half-adder circuit. The number of bits may be based on the desired threshold as described in more detail herein. Other example embodiments may use more or fewer numbers of bits. Similarly, while a particular counter architecture is shown, other circuits which adjust count values, such as other types of counter circuit may be used in other examples.

The counter 1300 is coupled to a set of LIO lines and sense amplifiers. For example, the counter 1300 may have a number of inputs each coupled to a node digitA of a sense amplifier 700 of FIGS. 7 and/or 1000 of FIG. 10. The counter 1300 receives a set of bits of a binary number XCount and adjusts the value to an updated value XCount'. In the example counter 1300, the value XCount' may generally be XCount+1. The counter 1300 includes a number of sub-circuits, each of which adjusts a bit of XCount<i> to a corresponding updated bit XCount'<i>. Each sub-circuit includes a pair of logic gates, an XNOR gate and an AND gate. Since the sub-circuits may be generally similar, they are indicated by similar number. For example, XNOR gate 1302 and AND gate 1304 receive a first bit XCount<0> and provide an updated XCount'<0>, XNOR gate 1312 and AND gate 1314 receive XCount<1> and provide XCount<1> and so forth up to XNOR gate 1372 and AND gate 1374 (since in this example embodiment XCount is an 8 bit number). Since the sub-circuits may generally be similar to each other, for the sake of brevity only some of the sub-circuits are described in detail.

The first XNOR gate 1302 has a first input coupled to XCount<0> and a second input coupled to a logical high value. The XNOR gate 1302 provides the bit XCount'<0>. Accordingly, the value XCount'<0> will be high if XCount<0> is a logical high, and XCount<0> will be a logical low otherwise. The first AND gate 1304 receives the same inputs, XCount<0> and a logical high, as the first XNOR gate 1302. The first AND gate 1304 provides a first Carry bit. The first Carry bit will be a logical high if XCount<0> is a logical high, and will be a logical low otherwise.

The subsequent sub-circuits may be generally similar to the first sub-circuit, except that each sub-circuit receives a bit of XCount and the value of Carry output by the AND circuit of the previous sub-circuit. For example, in the second sub-circuit the XNOR gate 1312 and AND gate 1314 receive the value XCount<1> and the value carry output by the AND gate 1304 of the previous sub-circuit. Accordingly, the value XCount'<1> will be a logical high if both the value Carry and XCount<1> have the same logical value, and will be a logical low otherwise, and the value Carry output by AND gate 1314 will be high if both Carry from AND gate 1304 and XCount<1> are both a logical high and will be a logical low otherwise. The value Carry provided by AND gate 1314 is provided as an input to the next sub-circuit (e.g., to XNOR gate 1322 and AND gate 1324).

The final sub-circuit (in this example AND gate 1374 and XNOR gate 1372) provides the updated count bit (e.g., XCount'<7>) and the row hammer flag RHAFlag. The AND gate 1374 provides the value RHAFlag (instead of a Carry bit). Accordingly, the value RHAFlag may act as 'virtual' most significant bit of XCount, and may become active when the maximum value of XCount is reached. In this manner, in embodiments using a counter such as counter 1300, the number of bits of XCount (and the number of LIOs activated in the counter mat) determine the aggressor threshold. The number of bits may be adjusted based on the desired threshold.

If the value RHAFlag becomes active, it may indicate that the row address associated with XCount is an aggressor. An aggressor register (e.g., 344 of FIG. 3) may store a current row address XADD responsive to RHAFlag becoming active. The value of RHAFlag becoming active may also cause the value XCount to be reset (e.g., a value of '0' written back as XCount').

Figure 14:
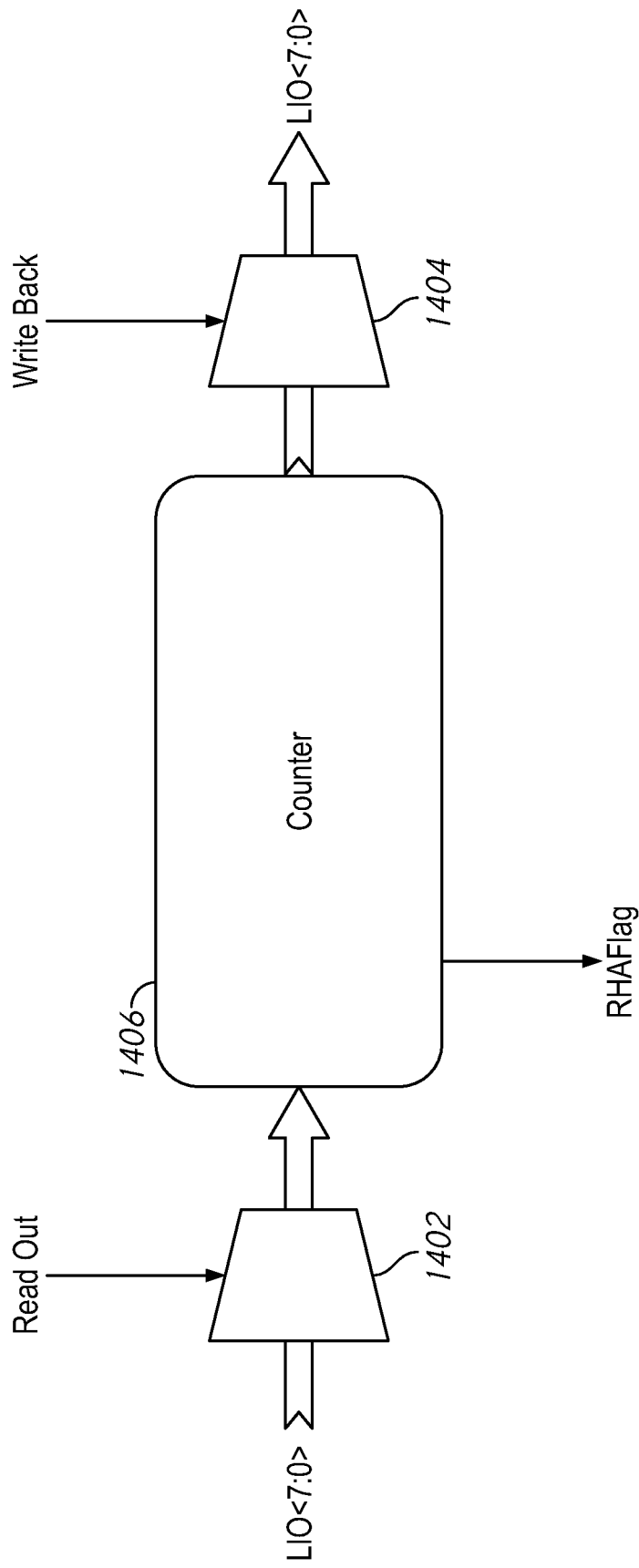
FIG. 14 is a block diagram of counter logic according to some embodiments of the present disclosure.

FIG. 14 is a block diagram of counter logic according to some embodiments of the present disclosure. The counter logic 1400 may, in some embodiments, be included in the counter 142 of FIG. 1, 207 of FIG. 2, 1128 of FIG. 11, 1264 of FIG. 12, and/or 1300 of FIG. 13. The counter logic 1400 shows components which may be useful for controlling the operation of a counter, such as the counter circuit 1300 of FIG. 13.

The counter logic 1400 has an input and output coupled to LIO lines which in turn are coupled via sense amplifiers (e.g., 140 of FIG. 1) to bit lines in a counter memory mat (e.g., 126 of FIG. 1). In the embodiment of FIG. 14, similar to the embodiment of FIG. 13, there are 8 LIO's which are activated as part of a given access operation (e.g., XCount is an 8 bit number). A counter circuit 1406 (e.g., 1300 of FIG. 13) receives the bits of XCount and provides and updated value XCount' back along the LIO to be written to the memory cells from which XCount was read.

To prevent conflicts between the data being read out and written back along the LIO lines, multiplexers 1402 and 1404 may be used to couple an input and output of the counter 1406 to the LIO. The multiplexers 1402 and 1404 may act as switches and be activated by respective Read and Write signals to control data coupled to the LIO lines. For example, initially the read signal may be active and the multiplexer 1402 may couple the LIO to the counter 1406, then the read signal may deactivate to decouple the LIO from the input of the counter, while a write signal may become active such that the multiplexer 1404 couples an output of the counter 1406 to the LIO.

In some embodiments, the counter logic 1400 may also include reset logic. The reset logic receives the row hammer flag RHAFlag from the counter circuit 1406. If the RHAFlag is active, then the reset logic 1408 alters the value XCount' before it is written back along the LIO. For example, the reset logic may set the value of XCount' to an initial value, such as by setting every bit along the LIO to a logical low as it is written back.

In some embodiments, such as the one depicted in FIG. 14, no additional reset logic is needed. For example, when the counter circuit 1406 operates in a manner similar the counter circuit 1300 of FIG. 13, then the value RHAFlag is provided at an active level when the count value 'rolls over' from a maximum value to its initial value. In such embodiments, the count is inherently reset when the value RHAFlag is active, and no further logic is needed.

Figure 15:
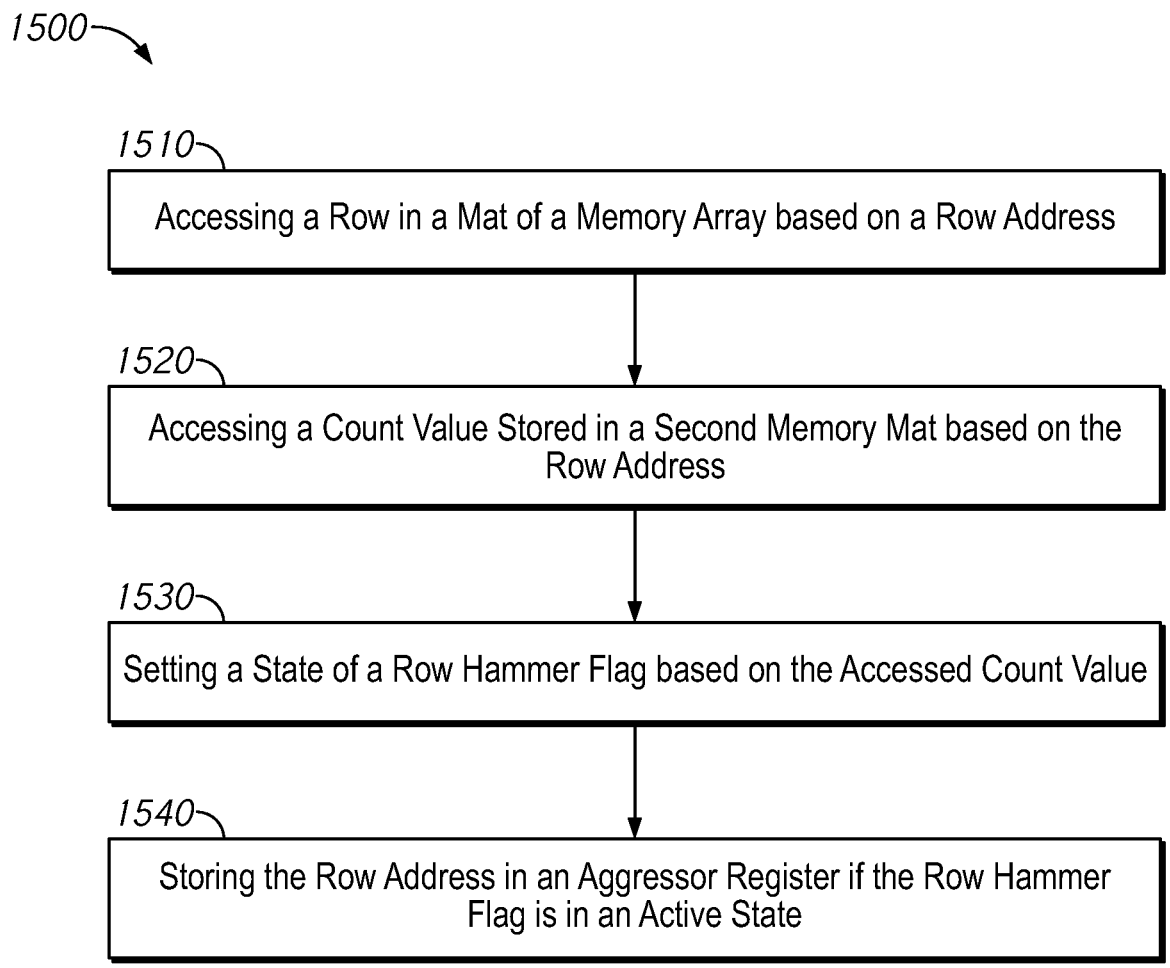
FIG. 15 is a flow chart of a method according to some embodiments of the present disclosure.

FIG. 15 is a flow chart of a method according to some embodiments of the present disclosure. The method 1500 may, in some embodiments be performed by one or more of the apparatuses or systems described in FIGS. 1-14.

The method 1500 includes box 1510, which describes accessing a row in a mat of a memory array (e.g., normal mat 130 or 132 of FIG. 1) based on a row address. For example a row decoder may receive the row address and access the word line associated with that row address.

The method 1500 includes box 1520, which describes accessing a count value in a second memory mat based on the row address. The second memory mat may be a counter memory mat (e.g., 126 of FIG. 1) which stores a number of count values, each associated with a row in one of the normal mats. The method may include generating a counter address with a mapping engine (e.g., 218 of FIG. 2). The counter address may include a row address for a row in the second memory mat and a column address, such as a column select address. The method may include activating a number of bit lines responsive to the column address portion of the counter address. The bit lines in the second memory mat may have a folded architecture in some embodiments.

The method 1500 includes box 1530, which describes setting a state of a row hammer flag based on the accessed count value. For example, the method 1500 may include reading the count value, changing the count value, and writing back the changed count value. The method 1500 may include setting the row hammer flag at an active level if the count value meets or exceeds a threshold. In some embodiments, the row hammer flag may represent a 'virtual' most significant bit which becomes active when row hammer address passes a maximum value. In some embodiments, the method 1500 may include resetting the count value responsive to the row hammer flag at the active state.

In some embodiments, access logic of the second memory mat (e.g., 330 of FIG. 3) may include a counter circuit (e.g., in the sense amplifier region). In such embodiments, the method 1500 may include reading the count value along LIO lines to the counter circuit, changing the count value with the counter circuit, writing the changed count value back along the LIO lines, and providing the row hammer flag along a GIO line. Accordingly, the method 1500 may include keeping the count value within the memory array and only receiving a row hammer flag.

The method 1500 includes box 1540 which describes storing the row address in an aggressor register if the row hammer flag is in an active state. For example the aggressor register (e.g., 212 of FIG. 2) may store the row address responsive to the flag being active. The method 1500 may include refreshing one or more victim word lines associated with the stored row address as part of a targeted refresh operation.

In at least one aspect, the present disclosure relates to an apparatus including a first memory mat, a second memory mat, and a refresh control circuit. The first memory mat includes a first plurality of memory cells at the respective intersections of a first number of word lines and a first number of bit lines. The first plurality of memory cells store data. The second memory mat includes a second plurality of memory cells at the respective intersections of a second number of word lines and a second number of bit lines. The second plurality of memory cells store a plurality of count values each associated with one of the first number of word lines. The refresh control circuit determines if one or more of the first word lines is an aggressor word line based on the stored plurality of count values.

The refresh control circuit may also change a selected one of the plurality of count values each time the associated one of the first number of word lines is accessed. The second number of word lines may be less than the first number of word lines. The apparatus may include a sense amplifier region positioned between the first memory mat and the second mat. The sense amplifier region may include sense amplifiers coupled to the first number of bit lines. The second number of bit lines may be shorter than the first number of bit lines.

The apparatus may also include a first sense amplifier region which includes a first plurality of sense amplifiers each coupled to one of the first number of bit lines and another bit line in another memory mat, and a second sense amplifier region which includes a second plurality of sense amplifiers each coupled to two of the second number of bit lines. Each of the second plurality of sense amplifiers may be coupled to a first bit line and a second bit line of the second number of bit lines. Along each of the second number of word lines, one of the first bit line and the second bit line may intersect one of the second plurality of memory cells and the other of the first bit line and the second bit line does not. Each of the plurality of sense amplifiers may include a first input which is coupled to a first bit line and a second bit line coupled to the first bit line, and a second input coupled to a reference voltage through a capacitor.

In at least one aspect, the present disclosure relates to an apparatus including a first memory mat, a second memory mat, and a sense amplifier region. The first memory mat includes a first plurality of memory cells at the respective intersections of a first number of word lines and a first number of bit lines, where the first plurality of memory cells are configured to store data. The second memory mat includes a second plurality of memory cells at the respective intersections of a second number of word lines and a second number of bit lines, where the second plurality of memory cells are configured to store a plurality of count values each associated with one of the first number of word lines. The sense amplifier region includes a plurality of sense amplifiers each coupled to two of the second number of bit lines in the second memory mat.

The apparatus may also include an aggressor detector circuit which determines if one or more of the first number of word lines is an aggressor word line based on the associated one of the plurality of count values. The aggressor detector circuit may be located in a bank logic region, and the second memory mat may be located between the bank logic region and the first memory mat.

Each of the plurality of sense amplifiers may be coupled to a first bit line and a second bit line of the second memory mat. Along each of the second number of word lines, one of the first bit line and the second bit line may intersect one of the second plurality of memory cells and the other of the first bit line and the second bit line may not. Each of the plurality of sense amplifiers may include a first input which is coupled to a first bit line and a second bit line coupled to the first bit line, and a second input coupled to a reference voltage through a capacitor. A capacitance of the capacitor may mimic a capacitance of the first and the second bit line.

In at least one aspect, the present disclosure relates to an apparatus including a memory mat and a sense amplifier region. The memory mat includes a plurality of word lines and a plurality of digit lines, where one of a plurality of memory cells are disposed at half of the intersections of the plurality of word lines and the plurality of digit lines. The plurality of sense amplifiers are each coupled to a first one and a second one of the plurality of digit lines. Along each of the plurality of word lines, one of the first one and the second one of the plurality of digit line is coupled to one of the plurality of memory cells and the other of the first one and the second one of the plurality of digit lines does not.

The first one and the second may either both be even or both be odd ones of the plurality of digit lines. The plurality of sense amplifiers may be organized into a first row and a second row, where each of the amplifiers of the first row are coupled to one of even or odd ones of the plurality of digit lines and the second row are coupled to the other of even or odd ones of the plurality of digit lines. The first row may be coupled to the digit lines through a first metal layer, and the second row may be coupled to the digit lines through a second metal layer above the first metal layer.

The apparatus may also include a second memory mat including a second plurality of word lines and a second plurality of digit lines, where one of a second plurality of memory cells are disposed at each intersection of the second plurality of word lines and the second plurality of digit lines, a third memory mat including a third plurality of word lines and a third plurality of digit lines, where one of a third plurality of memory cells are disposed at each intersection of the third plurality of word lines and the third plurality of digit lines, and a second sense amplifier region including a second plurality of sense amplifiers, each coupled to one of the second plurality of digit lines and one of the third plurality of digit lines. The plurality of memory cells may store count values associated with a number of accesses to the second plurality of word lines or the third plurality of word lines. The apparatus may include bank logic associated with the memory mat, the second memory mat, and the third memory mat, where the memory mat and the sense amplifier region are positioned between the bank logic and the second and the third memory mat.

In at least one aspect, the present disclosure may relate to an apparatus including a memory mat which includes a plurality of word lines and a plurality of digit lines, where one of a plurality of memory cells are disposed at each of the intersections of the plurality of word lines and the plurality of digit lines, and where pairs of the plurality of digit lines are coupled together, a plurality of capacitors, and a sense amplifier region which includes a plurality of sense amplifiers each comprising a first input coupled to one of digit line of each of the pairs of the digit lines and a second input coupled to a reference voltage through a respective one of the plurality of capacitors.

The apparatus may include a plurality of connectors coupling each of the pairs of the plurality of digit lines to each other. The plurality of connectors may be positioned at an end of the plurality of digit lines distal from the sense amplifier region. Each of the plurality of word lines may intersect a first memory cell along a first one of each of the pairs of the plurality of digit lines and a second memory cell along a second one of each of the pairs of the plurality of digit lines. Each of the plurality of capacitors may mimic a capacitance of each of the pairs of the plurality of bit lines.

The apparatus may also include a second memory mat, a third memory mat, and a second sense amplifier region. The second memory mat may include a second plurality of word lines and a second plurality of digit lines, where one of a second plurality of memory cells are disposed at each intersection of the second plurality of word lines and the second plurality of digit lines. The third memory mat may include a third plurality of word lines and a third plurality of digit lines, where one of a third plurality of memory cells are disposed at each intersection of the third plurality of word lines and the third plurality of digit lines. The second sense amplifier region may include a second plurality of sense amplifiers, each coupled to one of the second plurality of digit lines and one of the third plurality of digit lines.

In at least one aspect, the present disclosure relates to an apparatus including a first memory mat which includes a first plurality of word lines, a second memory mat which includes a second plurality of memory cells which store a plurality of count values, each associated with one of the plurality of word lines. The apparatus also includes a mapping engine which receives a row address associated with one of the plurality of word lines and generates a counter address associated the associated one of the plurality of count values. The apparatus also includes a plurality of access logic circuits each associated with one of the plurality of count values, where, when activated by the counter address, an activated one of the plurality of access logic circuits updates the associated one of the plurality of count values and provides a row hammer flag at an active level if the updated one of the plurality of count values meets or exceeds a threshold.

The counter address may activate a set of bit lines each coupled to a memory cell storing a bit of the associated one of the plurality of count values. Each of the access logic circuits may include a plurality of sense amplifiers, each coupled to one of the set of bit lines, and a counter circuit configured to update the count and provide the row hammer flag. The apparatus may include an aggressor register which stores the row address responsive to the row hammer flag being at the active level. The plurality of access logic circuits may be in a sense amplifier region associated with the second memory mat, and the aggressor register may be in a bank logic region associated with the first and the second memory mat.

Each of the plurality of access logic circuits may receive the associated one of the plurality of count values along a plurality of local input/output lines and provide the row hammer flag along a global input/output line. The activated one of the plurality of access logic circuits may reset the associated one of the plurality of count values responsive to the row hammer flag being at the active level.

In at least one aspect, the present disclosure relates to an apparatus including a memory mat, a counter circuit, a plurality of local input/output (LIO) lines, and a global input/output line (GIO). The memory mat includes a plurality of bit lines activated by a column select address, the plurality of bit lines intersecting a plurality of memory cells configured to store a count value. The counter circuit receives the count value from the activated plurality of bit lines, updates the count value, and writes the updated count value back along the plurality of bit lines. The counter circuit provides a row hammer flag at an active level if the updated count value meets or exceeds a threshold. The LIO lines couple the plurality of bit lines to the counter circuit. The GIO line transmits the row hammer flag to a bank logic region.

The apparatus may include a first multiplexer which couples the LIO lines to an input of the counter circuit when a read signal is active, and a second multiplexer which couples an output of the counter circuit to the LIO lines when a write signal is active. The apparatus may include a plurality of sense amplifiers coupled to the plurality of bit lines, where the each of the plurality of sense amplifiers is coupled to memory mat but not to another memory mat. The apparatus may also include an aggressor register which stores a row address associated with a word line in a second memory mat responsive to row hammer flag at the active level. The aggressor register may be located in the bank logic region. The counter circuit may be located in a sense amplifier region associated with the memory mat. The threshold may be based on a number of bits of the count value. The bank logic region may include a mapping engine configured to receive a row address and generate the column select address based on the row address.

In at least one aspect, the present disclosure relates to an apparatus including a first memory mat, a second memory mat, a row decoder which receives a row address associated with the first memory mat and generates a counter address associated with the second memory mat, where responsive to the counter address, the second memory mat is configured to provide a row hammer flag, and an aggressor register which stores the row address is the row hammer flag has an active state.

The second memory mat may store a plurality of count values, where the counter address is associated with one of the plurality of count values and where a state of the row hammer flag is based on the one of the plurality of count values. The apparatus may include access logic which may read a count value from the second memory mat, update the count value, and write back the updated count value responsive to the counter address, where the access logic is configured to provide the row hammer flag. The access logic may provide the row hammer flag at the active level responsive to the count value meeting or exceeding a threshold value. The access logic may reset the count value responsive to providing the row hammer flag at the active level. The row decoder may be located in a bank logic region and the access logic is located in a sense amplifier region.

In at least one aspect, the present disclosure relates to a method including accessing a row in a mat of a memory array based on a row address, accessing a count value stored in a second memory mat based on the row address, setting a state of a row hammer flag based on the accessed count value, and storing the row address in an aggressor register if the row hammer flag is in an active state.

The method may include setting the state of the row hammer flag with a counter circuit in a sense amplifier region associated with the second memory mat, and providing the row hammer flag to the aggressor register in a bank logic region. The method may include reading the count value along local input/output (LIO) lines to a counter circuit, changing the count value, writing the changed count value back along the LIO lines, and providing the row hammer flag along a global input/output (GIO) line. The method may include setting the row hammer flag to the active state if the count value meets or exceeds a threshold, and resetting the count value responsive to the row hammer flag at the active state. The method may also include generating a counter address based on the row address and accessing the count value responsive to the counter address.

In at least one aspect, the present disclosure relates to an apparatus including a first memory mat which includes a first word line and a second word line, a second memory mat which includes a third word line, and a mapping engine. The second memory mat also includes a first set of bit lines and a second set of bit lines, a first set of memory cells which store a first count value associated with the first word line disposed at the intersection of the third word line and the first set of bit lines, and a second set of memory cells which store a second count value associated with the second word line disposed at the intersection of the third word line and the second set of bit lines. The mapping engine receives a row address associated the first word line or the second word line and generates a counter address which specifies the third word line and the first set of memory cells if the row address is associated with the first word line and which specifies the third word line and the second set of memory cells if the row address is associated with the second word line.

The counter address may include a word line address associated with the word line and column select address associated with the first set of bit lines or the second set of bit lines. The apparatus may also include a first access logic circuit which updates the first count value responsive to the counter address specifying the third word line and the first set of memory cells, and a second access logic circuit which updates the second count value responsive to the counter address specifying the third word line and the second set of memory cells. The apparatus may also include a plurality of bit lines intersecting the first word line and the second word line, wherein selected ones of the plurality of bit lines are activated by a column decoder responsive to a column address different than the row address.

It is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a first memory mat comprising a first plurality of memory cells at respective intersections of a first number of word lines and a first number of bit lines, wherein the first plurality of memory cells are configured to store data;
a second memory mat comprising a second plurality of memory cells at respective intersections of a second number of word lines and a second number of bit lines, wherein the second plurality of memory cells are configured to store a plurality of count values each associated with one of the first number of word lines;
a refresh control circuit configured to determine if one or more of the first word lines is an aggressor word line based on the stored plurality of count values; and
a sense amplifier region positioned between the first memory mat and the second mat, wherein the sense amplifier region includes sense amplifiers coupled to the first number of bit lines.

2. The apparatus of claim 1, wherein the refresh control circuit is further configured to change a selected one of the plurality of count values each time the associated one of the first number of word lines is accessed.

3. The apparatus of claim 1, wherein the second number of word lines is less than the first number of word lines.

4. The apparatus of claim 1, wherein the second number of bit lines are shorter than the first number of bit lines.

5. The apparatus of claim 1, further comprising:
a first sense amplifier region comprising a first plurality of sense amplifiers each coupled to one of the first number of bit lines and another bit line in another memory mat; and
a second sense amplifier region comprising a second plurality of sense amplifiers each coupled to two of the second number of bit lines.

6. The apparatus of claim 5, wherein each of the second plurality of sense amplifiers is coupled to a first bit line and a second bit line of the second number of bit lines wherein along each of the second number of word lines, one of the first bit line and the second bit line intersects one of the second plurality of memory cells and the other of the first bit line and the second bit line does not.

7. The apparatus of claim 6, wherein each of the plurality of sense amplifiers includes a first input which is coupled to a first bit line and a second bit line coupled to the first bit line, and a second input coupled to a reference voltage through a capacitor.

8. An apparatus comprising:
a first memory mat comprising a first plurality of memory cells at respective intersections of a first number of word lines and a first number of bit lines, wherein the first plurality of memory cells are configured to store data;
a second memory mat comprising a second plurality of memory cells at respective intersections of a second number of word lines and a second number of bit lines, wherein the second plurality of memory cells are configured to store a plurality of count values each associated with one of the first number of word lines; and
a sense amplifier region comprising a plurality of sense amplifiers each coupled to two of the second number of bit lines in the second memory mat, wherein each of the plurality of sense amplifiers includes a first input which is coupled to a first bit line and a second bit line coupled to the first bit line, and a second input coupled to a reference voltage through a capacitor.

9. The apparatus of claim 8, further comprising an aggressor detector circuit configured to determine if one or more of the first number of word lines is an aggressor word line based on the associated one of the plurality of count values.

10. The apparatus of claim 9, wherein the aggressor detector circuit is located in a bank logic region, and wherein the second memory mat is located between the bank logic region and the first memory mat.

11. The apparatus of claim 8, wherein each of the plurality of sense amplifiers is coupled to a first bit line and a second bit line of the second memory mat wherein along each of the second number of word lines, one of the first bit line and the second bit line intersects one of the second plurality of memory cells and the other of the first bit line and the second bit line does not.

12. The apparatus of claim 8, wherein a capacitance of the capacitor mimics a capacitance of the first and the second bit line.

13. An apparatus comprising:
a first memory mat comprising a first plurality of memory cells at respective intersections of a first number of word lines and a first number of bit lines, wherein the first plurality of memory cells are configured to store data;
a second memory mat comprising a second plurality of memory cells at respective intersections of a second number of word lines and a second number of bit lines, wherein the second plurality of memory cells are configured to store a plurality of count values each associated with one of the first number of word lines;
a refresh control circuit configured to determine if one or more of the first word lines is an aggressor word line based on the stored plurality of count values;
a first sense amplifier region comprising a first plurality of sense amplifiers each coupled to one of the first number of bit lines and another bit line in another memory mat, and
a second sense amplifier region comprising a second plurality of sense amplifiers each coupled to two of the second number of bit lines, wherein each of the plurality of sense amplifiers includes a first input which is coupled to a first bit line and a second bit line coupled to the first bit line, and a second input coupled to a reference voltage through a capacitor.

14. An apparatus comprising:
a first memory mat comprising a first plurality of memory cells at respective intersections of a first number of word lines and a first number of bit lines;
a second memory mat comprising a second plurality of memory cells at respective intersections of a second number of word lines and a second number of bit lines; and
a refresh control circuit configured to determine if one or more of the first word lines is an aggressor word line based on the stored plurality of count values, wherein:
the first plurality of memory cells are configured to store data;
the second plurality of memory cells are configured to store a plurality of count values each associated with one of the first number of word lines; and
the second number of word lines is less than the first number of word lines.

15. An apparatus comprising:
a first memory mat comprising a first plurality of memory cells at respective intersections of a first number of word lines and a first number of bit lines;
a second memory mat comprising a second plurality of memory cells at respective intersections of a second number of word lines and a second number of bit lines; and
a refresh control circuit configured to determine if one or more of the first word lines is an aggressor word line based on the stored plurality of count values, wherein:
the first plurality of memory cells are configured to store data;
the second plurality of memory cells are configured to store a plurality of count values each associated with one of the first number of word lines; and
the second number of bit lines are shorter than the first number of bit lines.

\* \* \* \* \*